United States Patent [19]

Okamoto et al.

[11] Patent Number: 5,385,807
[45] Date of Patent: Jan. 31, 1995

[54] PHOTOPOLYMERIZABLE COMPOSITION

[75] Inventors: Yasuo Okamoto; Syunichi Kondo; Toshinao Ukai, all of Shizuoka, Japan

[73] Assignee: Fuji Photo Film Co., Ltd., Ashigara, Japan

[21] Appl. No.: 901,773

[22] Filed: Jun. 22, 1992

[30] Foreign Application Priority Data

Jun. 24, 1991 [JP] Japan .................... 3-152062

[51] Int. Cl.$^6$ .............................. G03C 1/72
[52] U.S. Cl. ................... 430/283; 430/281; 430/285; 430/287; 430/920; 522/13; 522/14; 522/15; 522/24; 522/25
[58] Field of Search ............ 430/920, 281, 283, 285, 430/287; 522/13, 14, 15, 24, 25

[56] References Cited

U.S. PATENT DOCUMENTS

| | | | |
|---|---|---|---|
| 3,563,749 | 2/1971 | Munder et al. | 430/920 |
| 4,481,276 | 11/1984 | Ishikawa et al. | 430/920 |
| 4,505,793 | 3/1985 | Tamoto et al. | |
| 4,789,619 | 12/1988 | Ruckert et al. | 430/926 |
| 5,011,760 | 4/1991 | Yamaguchi et al. | 430/920 |
| 5,049,481 | 9/1991 | Okamoto et al. | |

*Primary Examiner*—Christopher D. Rodee
*Attorney, Agent, or Firm*—Burns, Doane, Swecker & Mathis

[57] ABSTRACT

A photopolymerizable composition comprises: (i) a polymerizable compound carrying an addition-polymerizable unsaturated bond; (ii) a methine compound; (iii) at least one compound selected from the group consisting of: (a) compounds having carbon-halogen bonds, (b) aromatic onium salts, (c) organic peroxides, (d) thio compounds, (e) hexaaryl-biimidazoles, (f) ketooxime esters, and (g) compounds represented by the following general formula (III):

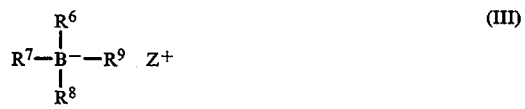

wherein $R^6$, $R^7$, $R^8$ and $R^9$ may be the same or different and each represents a substituted or unsubstituted alkyl, aryl, alkenyl, alkynyl or heterocyclic group, provided that at least two of $R^6$, $R^7$, $R^8$ and $R^9$ may be bonded together to form a ring structure and that at least one of them represents an alkyl group; and $Z^+$ represents an alkali metal cation or a quaternary ammonium cation. The composition has a high sensitivity to a wide range of actinic light rays extending from ultraviolet to visible light.

21 Claims, No Drawings

PHOTOPOLYMERIZABLE COMPOSITION

BACKGROUND OF THE INVENTION

The present invention relates to a photopolymerizable composition and more particularly to a photopolymerizable composition which comprises a polymerizable compound having an addition-polymerizable unsaturated bond, a photopolymerization initiator having a novel composition and an optional linear organic polymer, which is useful for preparing a light-sensitive layer of a presensitized plate for use in making a lithographic printing plate (PS plate) responsive to light rays from, for instance, an argon laser.

It has presently been well-known to photographically reproduce images using a light-sensitive composition which comprises a polymerizable compound having an addition-polymerizable unsaturated bond and a photopolymerization initiator as well as an optional appropriate binder having a film-forming ability and an optional heat-polymerization inhibitor. More specifically, the light-sensitive composition of this type, as disclosed in U.S. Pat. Nos. 2,927,022, 2,902,356 and 3,870,524, is photopolymerized through irradiation with light so that it is hardened and hence be rendered insoluble in a developer. Therefore, a desired hardened image can be obtained from the light-sensitive composition by forming the composition into an appropriate film, imagewise exposing the film to light through a desired negative image and then removing only the non-exposed portion with a proper solvent (hereinafter simply referred to as "developing or development"). The light-sensitive composition of this type is very useful as a material for preparing, for instance, a lithographic printing plate.

There has likewise been proposed the addition of a photopolymerization initiator to a polymerizable compound having an addition-polymerizable unsaturated bond for enhancing the light-sensitivity thereof since the compound per se shows insufficient light-sensitivity. As such photopolymerization initiators, there have been used, for instance, benzyl, benzoin, benzoin ethyl ether, Michler's ketones, anthraquinone, acridine, phenazine, benzophenone and 2-ethylanthraquinone. However, when these photopolymerization initiators are used, it takes a long time to expose the resulting composition to light to form images since the photopolymerizable composition is less responsive to hardening. For this reason, any fine image having good quality cannot be reproduced even if there is a slight vibration during operations and further it is necessary to increase the dose of light energy for imagewise exposure. Accordingly, an appropriate measure must be taken to radiate heat generated during exposure. In addition, the heat generation often accompanies the deformation and change of properties of the film formed from the composition.

Moreover, the responsibility of these photopolymerization initiators to visible lights of not less than 400 nm is substantially lower than the responsibility thereof to UV lights of less than 400 nm. For this reason, the light-sensitive compositions comprising these conventional photopolymerization initiators are quite limited in their applications.

There have been proposed, some photopolymerizable systems which are responsive to visible light rays. For instance, U.S. Pat. No. 2,850,445 proposes that certain kinds of photoreducible dyes exhibit excellent responsibility to visible lights, such as Rose Bengale, Eosine and Erythrosine. As other improved techniques, there have been proposed, for instance, composite initiator systems of dyes and amines (Japanese Patent Publication for Opposition Purpose (hereinafter referred to as "J.P. KOKOKU") No. Sho 44-20189); a system comprising hexaaryl-biimidazole, a radical generator and a dye (J.P. KOKOKU No. Sho 45-37377); systems comprising hexaaryl-biimidazole and p-dialkylaminobenzylidene ketones (J.P. KOKOKU No. Sho 47-2528 and Japanese Unexamined Patent Publication (hereinafter referred to as "J.P. KOKAI") No. Sho 54-155292(=U.S. Pat. No. 4,162,162); a system comprising a 3-keto-substituted coumarin compound and an active halogen compound (J.P. KOKAI No. Sho 58-15503(=U.S. Pat. No. 4,505,793)); and a system comprising a substituted triazine and a merocyanine dye. These techniques are certainly effective for obtaining compositions sensitive to visible lights, but the rate of imagewise exposure to light has not yet been satisfied and there is much room for further improvement.

Recently, there has been investigated the development of light-sensitive compositions highly sensitive to UV lights and methods for forming images using lasers, UV projection exposure methods, direct plate-making methods by lasers, laser facsimiles, holography techniques or the like have already been put into practical use and there have been developed light-sensitive materials having high sensitivity acceptable in these techniques. However, light-sensitive materials having satisfactory sensitivity have not yet been developed.

SUMMARY OF THE INVENTION

Accordingly, an object of the present invention is to provide a highly sensitive photopolymerizable composition and more specifically, to provide a light-sensitive composition comprising a photopolymerization initiator capable of accelerating the polymerization velocity of the photopolymerizable light-sensitive composition which generally comprises a polymerizable compound carrying an addition-polymerizable unsaturated bond.

Another object of the present invention is to provide a photopolymerizable composition comprising a photopolymerization initiator which is highly sensitive to visible lights having wavelengths of not less than 400 nm, in particular visible lights of about 488 nm corresponding to the output of $Ar^+$ lasers.

The inventors of this invention have conducted various studies to achieve the foregoing objects, have found that a specific photopolymerization initiator system can substantially enhance the photopolymerization rate of a polymerizable compound carrying an addition-polymerizable unsaturated bond and is highly sensitive to visible lights having wavelength of not less than 400 nm and have thus completed the present invention.

According to the present invention, the foregoing objects can effectively be accomplished by providing a photopolymerizable composition which comprises (i) a polymerizable compound carrying an addition-polymerizable unsaturated bond;

(ii) a methine compound represented by the following general formula (I):

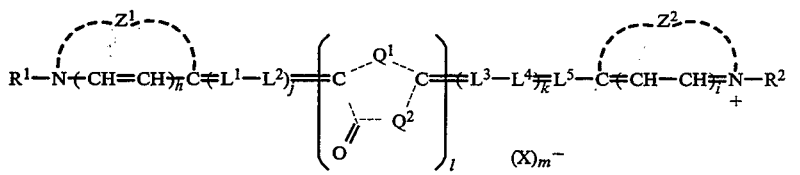

wherein $Z^1$ and $Z^2$ each represents a group of non-metallic atoms required for forming a 5- and/or 6-membered nitrogen atom-containing heterocyclic ring included in cyanine dyes commonly used; $R^1$ and $R^2$ each represents an alkyl group; $Q^1$ and $Q^2$ represent groups of atoms required for forming a 4-thiazolidinone, 5-thiazolidinone, 4-imidazolidinone, 5-imidazolidinone, 4-oxazolidinone, 5-oxazolidinone or 4-dithiolanone ring together with the carbon atoms; $L^1$, $L^2$, $L^3$, $L^4$ and $L^5$ each represents a methine group; m is 1 or 2; i and h each represents 0 or 1; l is 1 or 2; j and k each represents 0, 1, 2 or 3; and $X^-$ represents an anion;

(iii) at least one compound selected from the group consisting of:
 (a) compounds having carbon-halogen bonds;
 (b) aromatic onium salts;
 (c) organic peroxides;
 (d) thio compounds represented by the following general formula (II):

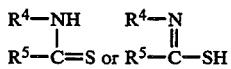

wherein $R^4$ represents an alkyl, aryl or substituted aryl group; $R^5$ represents a hydrogen atom or an alkyl group and $R^4$ and $R^5$ may be bonded together to form a group of non-metallic atoms required for forming a 5- to 7-membered ring which may comprise hetero atoms selected from oxygen, sulfur and nitrogen atoms;
 (e) hexaaryl-biimidazoles;
 (f) ketoxime esters; and
 (g) compounds represented by the following general formula (III):

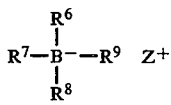

wherein $R^6$, $R^7$, $R^8$ and $R^9$ may be the same or different and each represents a substituted or unsubstituted alkyl, aryl, alkenyl, alkynyl or heterocyclic group, provided that at least two of $R^6$, $R^7$, $R^8$ and $R^9$ may be bonded together to form a ring structure, and that at least one of them represents an alkyl group; and $Z^+$ represents an alkali metal cation or a quaternary ammonium cation; and optionally (iv) a compound represented by the following general formula (IV):

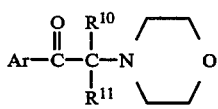

wherein Ar represents an aromatic group selected from those represented by the following general formulas and $R^{10}$ and $R^{11}$ each represents a hydrogen atom or an alkyl group or $R^{10}$ and $R^{11}$ may be bonded to form an alkylene group:

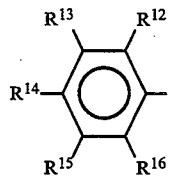

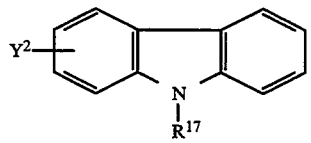

wherein $R^{12}$, $R^{13}$, $R^{14}$, $R^{15}$ and $R^{16}$ may be the same or different and each represents a hydrogen or halogen atom, an alkyl or alkenyl group, a substituted or unsubstituted aryl or alkoxy group, a hydroxyl group or $-S-R^{18}$, $-SO-R^{18}$ or $-SO_2R^{18}$, provided that at least one of $R^{12}$, $R^{13}$, $R^{14}$, $R^{15}$ and $R^{16}$ represents $-S-R^{18}$, $-SO-R^{18}$ or $-SO_2R^{18}$ (wherein $R^{18}$ represents an alkyl or alkenyl group); $R^{17}$ represents a hydrogen atom or an alkyl or acyl group; and $Y^2$ represents a hydrogen atom or a group represented by the following general formula:

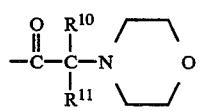

wherein $R^{10}$ and $R^{11}$ are the same as those defined above.

DESCRIPTION OF THE PREFERRED EMBODIMENTS

Each component of the photopolymerizable composition of the present invention will hereinafter be explained in detail.

Component (i), the polymerizable compound carrying an addition-polymerizable unsaturated bond used in the present invention is selected from polymerizable compounds carrying at least one, preferably at least two terminal ethylenically unsaturated bonds in the molecule.

Component (i) may be a compound having a chemical structure such as a monomer, a prepolymer (e.g., a dimer, trimer or oligomer), mixture thereof or a copolymer thereof. Examples of monomers and copolymers thereof include esters of unsaturated carboxylic acids (for instance, (meth)acrylic acid, itaconic acid, crotonic acid, isocrotonic acid and maleic acid) with aliphatic polyhydric alcohols and amides of unsaturated carboxylic acids with aliphatic polyvalent amines.

Specific examples of esters of unsaturated carboxylic acids with aliphatic polyhydric alcohols include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers;

methacrylates such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy) phenyl]dimethylmethane and bis [p-(methacryloxyethoxy) phenyl]dimethylmethane;

itaconates such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonates such as ethylene glycol dicrotonate, tetramethylene glycol dicrotonate, pentaerythritol dicrotonate and sorbiol tetracrotonate;

isocrotonates such as ethylene glycol diisocrotonate, pentaerythritol diisocrotonate and sorbitol tetraisocrotonate; and maleates such as ethylene glycol dimaleate, triethylene glycol dimaleate, pentaerythritol dimaleate and sorbitol tetramaleate.

It is also possible to use mixture of the foregoing ester monomers.

Specific examples of monomeric amides of aliphatic polyvalent amines with unsaturated carboxylic acids are methylenebis-(meth)acrylamide, 1,6-hexamethylenebis-(meth)acrylamide, diethylenetriamine trisacrylamide and xylylenebis-(meth)acrylamide.

Other examples of Component (i) include vinylurethane compounds having at least two polymerizable vinyl groups in the molecule which are prepared by adding vinyl monomers having hydroxyl groups represented by the following general formula (A) to polyisocyanate compounds having at least two isocyanate groups in the molecule, such as those disclosed in J.P. KOKOKU No. Sho 48-41708:

$$CH_2=C(R)COOCH_2CH(R')OH \quad (A)$$

wherein R and R' each represents —H or —CH$_3$.

Examples of Component (i) further include urethane acrylates such as those disclosed in J.P. KOKAI No. Sho 51-37193; polyester acrylates such as those disclosed in J.P. KOKAI No. Sho 48-64183 and J.P. KOKOKU Nos. Sho 49-43191 and Sho 52-30490; polyfunctional acrylates and methacrylates such as epoxy (meth)acrylates obtained by reacting epoxy resins with (meth)acrylic acids; and photohardenable monomers and oligomers disclosed in Journal of The Adhesion Society of Japan, 1984, 20, No. 7, pp. 300–308. The amount of Component (i) ranges from 5 to 50% by weight (hereinafter simply referred to as "%"), preferably 10 to 40% on the basis of the total weight of the photopolymerizable composition.

Component (ii) used in the present invention comprises at least one compound selected from the group consisting of those represented by the following general formula (I):

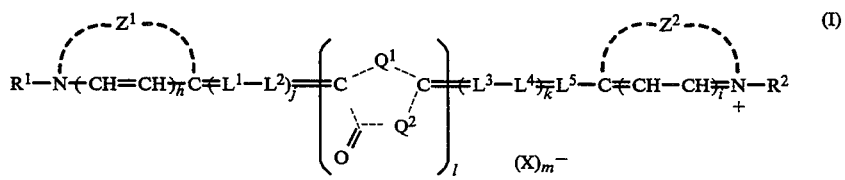

In Formula (I), $Z^1$ and $Z^2$ each represents a group of non-metallic atoms required for forming 5- and/or 6-membered nitrogen atom-containing heterocyclic rings included in cyanine dyes commonly used; $R^1$ and $R^2$ each represents an alkyl group; $Q^1$ and $Q^2$ represent groups of atoms required for forming a 4-thiazolidinone, 5-thiazolidinone, 4-imidazolidinone, 5-imidazolidinone, 4-oxazolidinone, 5-oxazolidinone or 4-dithiolanone ring together with the carbon atoms; $L^1$, $L^2$, $L^3$, $L^4$ and $L^5$ each represents a methine group; m is 1 or 2, preferably 1; i and h each represents 0 or 1; l is 1 or 2; j and k each represents 0, 1, 2 or 3, preferably 0, 1 or 2, provided that the sum of j and k is preferably not more than 3 and more preferably 0, 1 or 2; and X$^-$ represents an anion.

In Formula (I), the alkyl groups denoted by $R^1$ and $R^2$ herein includes linear and cyclic, saturated and unsaturated, and branched alkyl groups as well as substituted and unsubstituted alkyl groups.

Specific examples of $R^1$, and $R^2$ are unsubstituted alkyl groups, preferably those having at most 18 carbon atoms (such as methyl, ethyl, propyl, butyl, pentyl, octyl, decyl, dodecyl and octadecyl groups); cyclic alkyl groups such as cyclopropyl, cyclopentyl and cyclohexyl groups; unsaturated alkyl groups such as vinyl, vinylmethyl, 2-butenyl, 3-butenyl and 3-hexenyl groups; branched alkyl groups such as isobutyl, 4-methylpentyl and 2-ethylhexyl groups; substituted alkyl groups, preferably those having not more than 18 carbon atoms (preferred substituents include, for instance, carboxyl group, cyano group, halogen atoms such as fluorine, chlorine and bromine atoms, hydroxyl group, alkoxycarbonyl group having not more than 8 carbon atoms such as methoxycarbonyl, ethoxycarbonyl, phenoxycarbonyl and benzyloxycarbonyl groups, alkoxy groups having not more than 8 carbon atoms such as methoxy, ethoxy, benzyloxy and phenethyloxy groups, monocyclic aryloxy groups having not more than 10 carbon atoms such as phenoxy and p-tolyloxy groups, acyloxy groups having not more than 8 carbon atoms such as acetyloxy and propionyloxy groups, acyl groups having not more than 8 carbon atoms such as acetyl, propionyl, benzoyl and mesyl groups, carbamoyl groups such as carbamoyl, N,N-dimethylcarbamoyl, morpholinocarbonyl and piperidinocarbonyl groups, sulfamoyl groups such as sulfamoyl, N,N-dimethylsulfamoyl, morpholinosulfonyl and piperidinosulfonyl groups, and aryl groups having not more than 10 carbon atoms such as phenyl, 4-chlorophenyl, 4-methylphenyl and α-naphthyl groups).

$Z^1$ and $Z^2$ each represents a group of non-metallic atoms required for forming 5- and/or 6-membered nitrogen atom-containing heterocyclic rings. Specific examples of the rings preferably used are thiazole nuclei such as thiazole, 4-methylthiazole, 4-phenylthiazole, 5-methylthiazole, 5-phenylthiazole, 4,5-dimethylthiazole, 4,5-diphenylthiazole and 4-(2-thienyl)thiazole rings; benzothiazole nuclei such as benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5,6-dimethylbenzothiazole, 5-bromobenzothiazole, 6-bromobenzothiazole, 5-iodobenzothiazole, 5-trifluoromethylbenzothiazole, 5-phenylbenzothiazole, 4-methoxybenzothiazole, 5-methoxybenzothiazole, 6-methoxy-benzothiazole, 5-carboxybenzothiazole, 5-cyanobenzothiazole, 5-fluorobenzothiazole, 5-ethoxybenzothiazole, tetrahydro-benzothiazole, 5,6-dimethoxybenzothiazole, 5-hydroxybenzothiazole, 6-hydroxybenzothiazole and 5,6-dihydroxybenzothiazole rings; naphthothiazole nuclei such as naphtho- [1,2-d]thiazole, naphtho- [2,1-d]thiazole, naphtho-[2,3-d]thiazole, 5-methoxynaphtho-[2,1-d]thiazole, 5-ethoxynaphtho-[2,1-d]thiazole, 8-methoxynaphtho-[1,2-d]thiazole, 7-methoxynaphtho-[1,2-d]thiazole and 8,9-dihydronaphtho-[1,2-d]thiazole rings; oxazole nuclei such as 4-methyloxazole, 5-methyloxazole, 4-phenyloxazole, 4,5- diphenyloxazole, 4-ethyloxazole, 4,5-dimethyloxazole and 5-phenyloxazole; benzoxazole nuclei such as benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 5-methoxybenzoxazole, 5-ethoxybenzoxazole, 5-fluorobenzoxazole, 6-methoxybenzoxazole, 5-hydroxybenzoxazole and 6-hydroxybenzoxazole rings; naphthoxazole nuclei such as naphtho[1,2-d]oxazole, naphtho[2,1-d]oxazole and naphtho [2,3-d]oxazole rings; selenazole nuclei such as selenazole, 4-methylselenazole, 4-phenylselenazole and 4,5-diphenylselenazole rings; benzoselenazole nuclei such as benzoselenazole, 5-chlorobenzoselenazole, 5-methylbenzoselenazole, 5-methoxybenzoselenazole and 5-phenylbenzoselenazole rings; naphthoselenazole nuclei such as naphtho[1,2-d]selenazole, naphtho[2,1-d]selenazole and naphtho[2,3-d]selenazole rings; tellurazole nuclei such as benzotellurazole, 5-methylbenzotellurazole, 5,6-dimethylbenzotellurazole, naphtho[1,2-d]tellurazole, naphtho[2,1-d]tellurazole, naphtho[2,3-d]tellurazole and 6-methoxynaphtho[1,2-d]tellurazole rings; thiazoline nuclei such as thiazoline, 4-methylthiazoline and 4-phenylthiazoline rings; oxazoline nuclei such as 5,5-dimethyloxazoline ring; isooxazole nuclei such as 5-methylisooxazole ring; benzoisooxazole nuclei such as benzoisooxazole ring; 3,3-dialkylindolenine nuclei such as 3,3-dimethylindolenine, 3,3,5-trimethylindolenine, 5-chloro-3,3-dimethylindolenine, 5-ethoxycarbonyl-3,3-dimethylindolenine, 4,5-benzo-3,3-dimethylindolenine and 6,7-benzo-3,3-dimethylindolenine rings; 2-pyridine nuclei such as pyridine and 5-methylpyridiene rings; 4-pyridine nuclei such as pyridine ring; 2-quinoline nuclei such as 6-ethoxyquinoline, 6-ethylquinoline, 6-chloroquinoline and 8-fluoroquinoline rings; 4-quinoline nuclei such as 8-methylquinoline, 8-fluoroquinoline and 6-chloroquinoline rings; 1-isoquinoline nuclei such as isoquinoline ring; naphthyridine nuclei such as 7-methyl-1,8-naphthyridine and 8-methyl-1,5-naphthyridine rings; tetrazole nuclei such as methyltetrazole, ethyltetrazole and phenyltetrazole rings; imidazo[4,5-b]quinoxaline nuclei such as 1-ethylimidazo [4,5-b]quinoxaline, 1-methylimidazo[4,5-b]quinoxaline, 1-phenylimidazo[4,5-b]quinoxaline, 1-(2-methoxyethyl)imidazo[4,5-b]quinoxaline and 6-chloro-1-butylimidazo[4,5-b]quinoxaline rings; 4,9-dioxo-4, 9-dihydronaphtho[2,3-d]imidazole nuclei such as 1-butyl-4,9-dioxonaphtho[2,3-d]imidazole and 1-(2-methylpropyl)-4,9-dioxonaphtho[2,3-d]imidazole rings.

Among the rings mentioned above, preferred are thiazoline nuclei, thiazole nuclei, benzothiazole nuclei, naphthothiazole nuclei, oxazole nuclei, benzoxazole nuclei, naphthoxazole nuclei, 2-pyridine nuclei, 4-quinoline nuclei and imidazo[4,5-b]quinoxaline nuclei.

$L^1$, $L^2$, $L^3$, $L^4$ and $L^5$ each represents a methine group (including a substituted methine and a methine which has a ring on the chain thereof). Examples of substituents for the methine group are preferably alkyl groups having 1 to 4 carbon atoms such as methyl, ethyl, propyl and butyl groups; aryl groups having 6 to 10 carbon atoms such as phenyl, 2-carboxyphenyl, 4-methylphenyl and 2-chlorophenyl groups; substituted alkyl groups having 1 to 9 carbon atoms such as chloromethyl, benzyl, 2-phenylethyl, 3-phenylpropyl and methoxyethyl groups; alkoxy groups having 1 to 6 carbon atoms such as methoxy, ethoxy, butoxy and hexyloxy groups; and aryloxy groups having 6 to 12 carbon atoms such as phenoxy, 4-chlorophenoxy, 4-methylphenoxy and naphthoxy groups. In addition, preferred are those in which at least two substituents of the groups $L^1$, $L^2$, $L^3$, $L^4$ and $L^5$ are bonded together to form a 5- or 6-membered ring on the methine chain and those in which a substituent of $L^1$ or $L^2$ and $R^1$, and/or a substituent of $L^3$, $L^4$ or $L^5$ and $R^2$ are bonded to form a 5- or 6-membered ring.

$X^-$ may be a variety of anions, for instance, $SO_4^{2-}$, $S_2O_3^{2-}$, $SO_3^{2-}$, halogen ions, $ClO_4^-$, $BF_4^-$, $PF_6^-$, $SbF_6^-$, $BiCl_5^-$, $AsF_6^-$, $SbCl_6^-$, $SnCl_6^-$, $R-SO_3^-$ and $R-COO^-$, wherein R represents a hydrogen atom or an alkyl, aryl or heterocyclic group.

Specific examples of the compounds represented by Formula (I) used in the present invention will be given below, but the present invention is by no means limited to these specific examples.

| | $\lambda_{max}^{MeOH}$ (nm) |
|---|---|
| (i)-1 | 488 |
| (ii)-2 | 487 |
| (ii)-3 | 500 |
| (ii)-4 | 508 |
| (ii)-5 | 501 |
| (ii)-6 | 484 |
| (ii)-7 | 473 |

-continued

| | | $\lambda_{max}^{MeOH}$ (nm) |
|---|---|---|
| (ii)-8 | | 494 |
| (ii)-9 | | 492 |
| (ii)-10 | | 484 |
| (ii)-11 | | 511 |
| (ii)-12 | | 485 |
| (ii)-13 | | 489 |
| (ii)-14 | | 489 |

| | | $\lambda_{max}^{MeOH}$ (nm) |
|---|---|---|
| (ii)-15 | [structure] | 491 |
| (ii)-16 | [structure] | 516 |
| (ii)-17 | [structure] | 495 |
| (ii)-18 | [structure] | 505 |
| (ii)-19 | [structure] | 482 |
| (ii)-20 | [structure] | 488 |
| (ii)-21 | [structure] | 488 |

-continued
| | | $\lambda_{max}^{MeOH}$ (nm) |
|---|---|---|
| (ii)-22 | 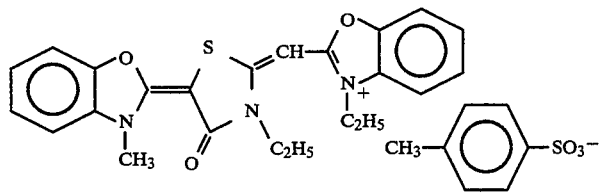 | 465 |
| (ii)-23 | 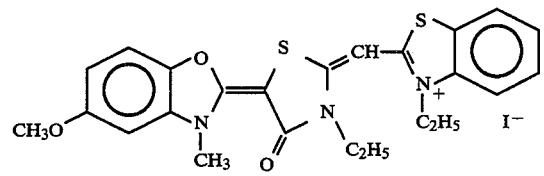 | 485 |
| (ii)-24 | 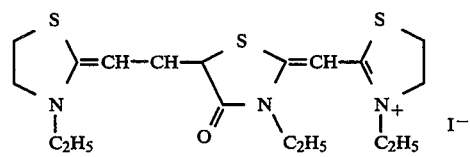 | 529 |
| (ii)-25 | 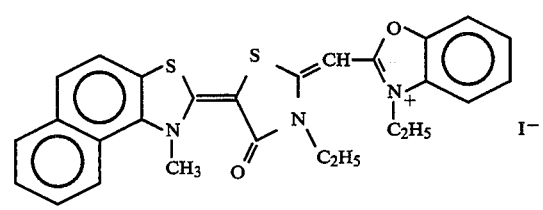 | 502 |
| (ii)-26 | 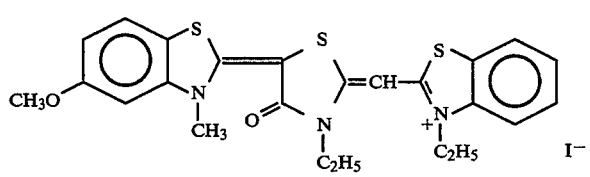 | 508 |
| (ii)-27 | 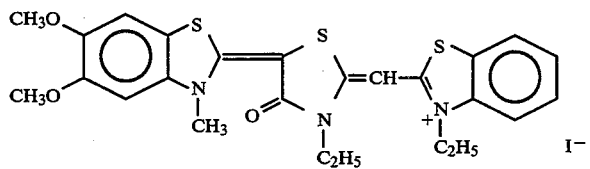 | 518 |
| (ii)-28 | 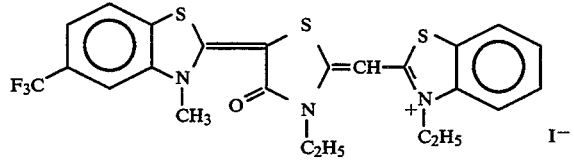 | 495 |
| (ii)-29 | 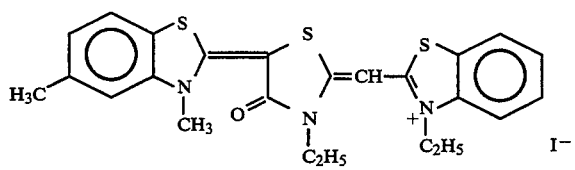 | 504 |

| | $\lambda_{max}^{MeOH}$ (nm) |
|---|---|
| (ii)-30 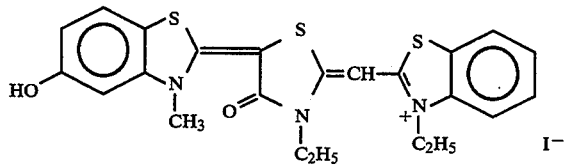 | 510 |
| (ii)-31 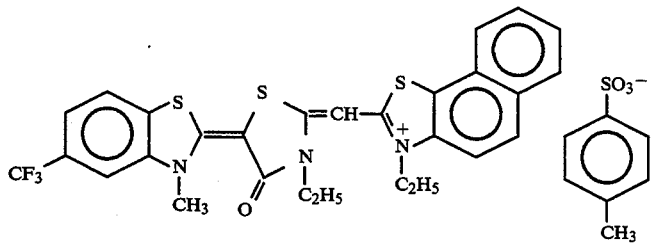 | 508 |
| (ii)-32 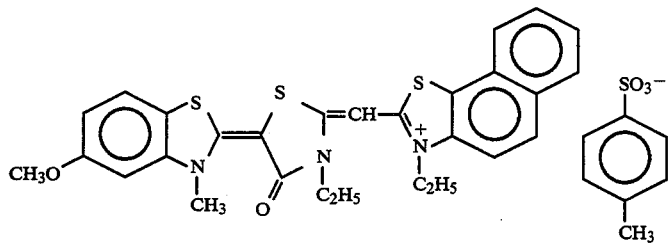 | 516 |
| (ii)-33 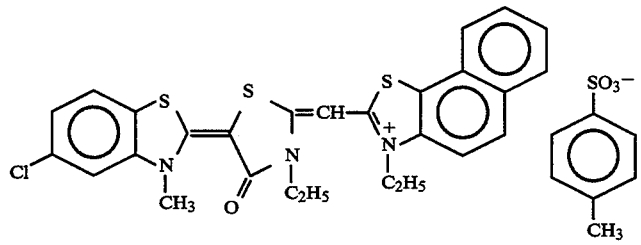 | 510 |
| (ii)-34 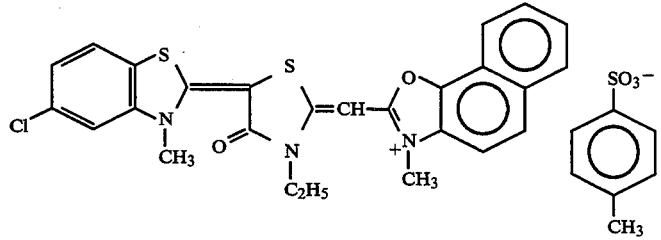 | 495 |
| (ii)-35 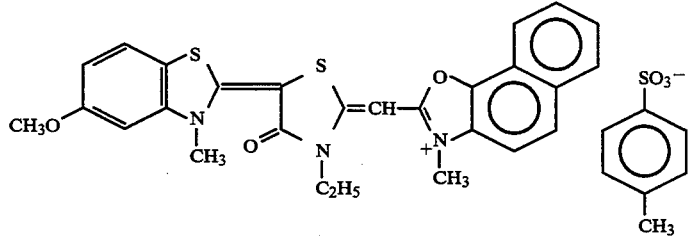 | 502 |

| | | $\lambda_{max}^{MeOH}$ (nm) |
|---|---|---|
| (ii)-36 | [structure] | 486 |
| (ii)-37 | [structure] | 564 |
| (ii)-38 | [structure] | 484 |
| (ii)-39 | [structure] | 543 |
| (ii)-40 | [structure] | 550 |
| (ii)-41 | [structure] | 594 |
| (ii)-42 | [structure] | 595 |

-continued

| | | $\lambda_{max}^{MeOH}$ (nm) |
|---|---|---|
| (ii)-43 | | 584 |
| (ii)-44 | | 615 |
| (ii)-45 | | 613 |
| (ii)-46 | | 599 |
| (ii)-47 | | 608 |
| (ii)-48 | | 591 |
| (ii)-49 | | 596 |

-continued

| | | $\lambda_{max}^{MeOH}$ (nm) |
|---|---|---|
| (ii)-50 | | 605 |
| (ii)-51 | | 588 |
| (ii)-52 | | 625 |
| (ii)-53 | | 604 |
| (ii)-54 | | 624 |
| (ii)-55 | | 605 |
| (ii)-56 | | 611 |

-continued

| | | $\lambda_{max}^{MeOH}$ (nm) |
|---|---|---|
| (ii)-57 | [structure] | 590 |
| (ii)-58 | [structure] | 587 |
| (ii)-59 | [structure] | 654 |
| (ii)-60 | [structure] | 577 |
| (ii)-61 | [structure] | 586 |
| (ii)-62 | [structure] | 592 |

-continued

| | | $\lambda_{max}^{MeOH}$ (nm) |
|---|---|---|
| (ii)-63 | | 678 |
| (ii)-64 | | 671 |
| (ii)-65 | | 659 |
| (ii)-66 | | 615 |
| (ii)-67 | | 671 |
| (ii)-68 | | 661 |

-continued
| | | $\lambda_{max}^{MeOH}$ (nm) |
|---|---|---|
| (ii)-69 | 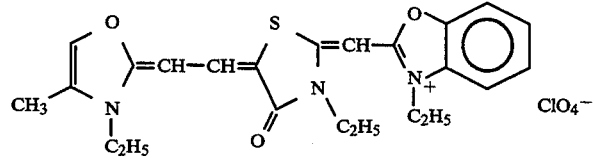 | 525 |
| (ii)-70 | 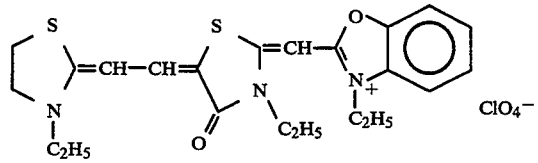 | 508 |
| (ii)-71 | 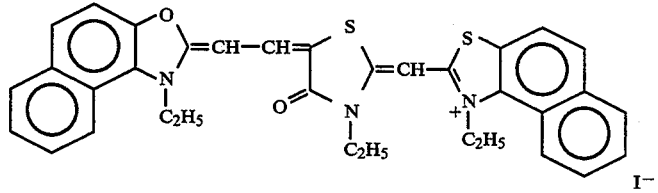 | 587 |
| (ii)-72 | 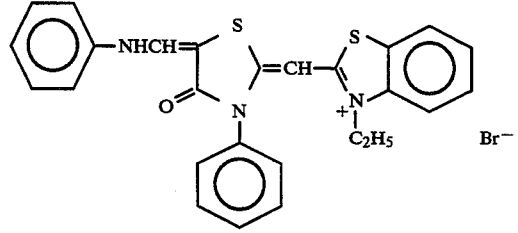 | 480 |
| (ii)-73 | 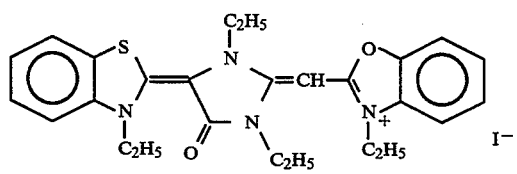 | 559 |
| (ii)-74 | 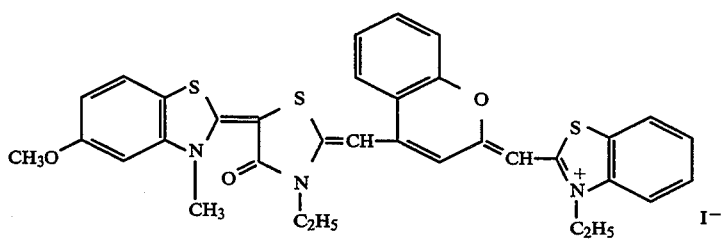 | 658 |
| (ii)-75 | 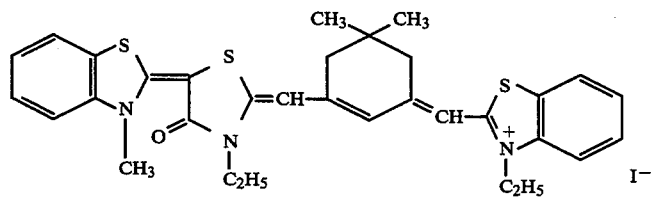 | 706 |

|  | $\lambda_{max}^{MeOH}$ (nm) |
|---|---|
| (ii)-76 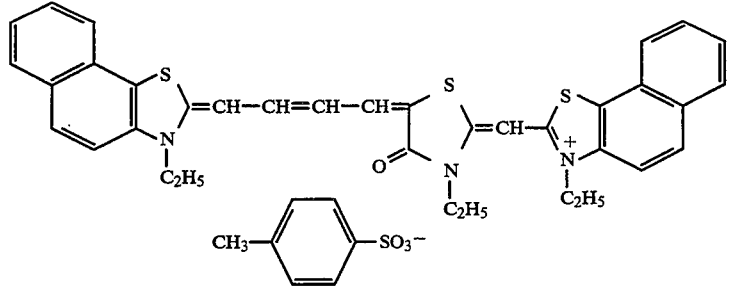 | 711 |
| (ii)-77 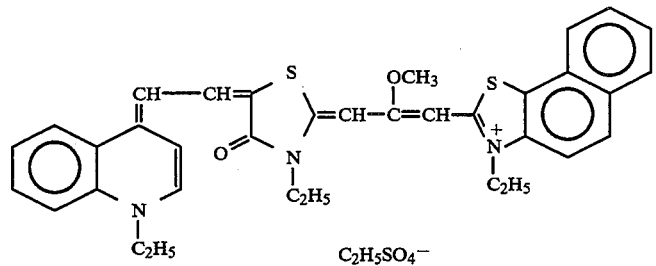 | 716 |
| (ii)-78 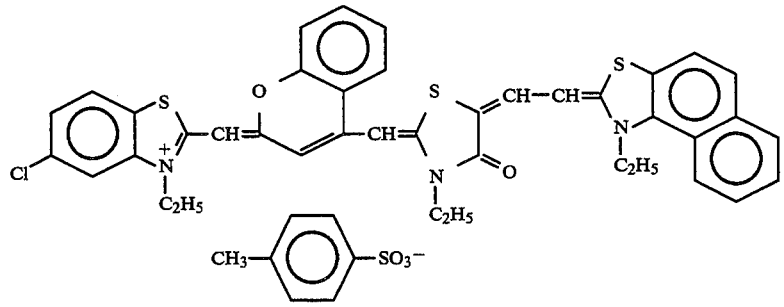 | 734 |
| (ii)-79 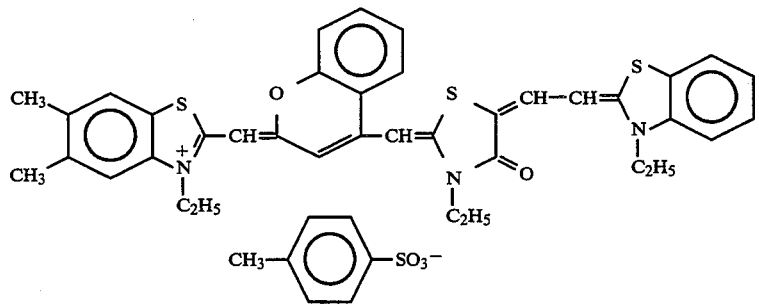 | 450 702 |
| (ii)-80 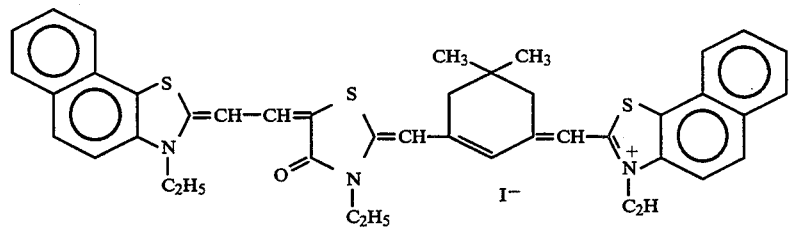 | 767 |

-continued

| | | $\lambda_{max}^{MeOH}$ (nm) |
|---|---|---|
| (ii)-81 | 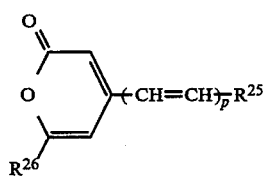 | 559 |
| (ii)-82 | | 534 |
| (ii)-83 | 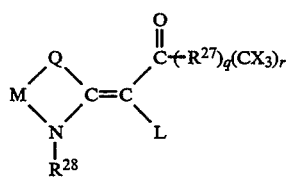 | 486 505 |

Component (iii)-(a), compounds having carbon-halogen bonds, used in preferred embodiments of the present invention preferably include, for instance, those represented by the following general formulas (V) to (XI), i.e., compounds of Formula (V):

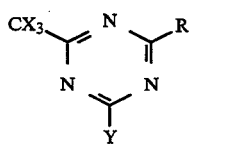 (V)

wherein X represents a halogen atom; Y represents —CX₃, —NH₂, —NHR′, —NR′₂ or —OR′ (R′ represents an alkyl, substituted alkyl, aryl or substituted aryl group); and R represents —CX₃ or an alkyl, substituted alkyl, aryl, substituted aryl or substituted alkenyl group; compounds of Formula (VI):

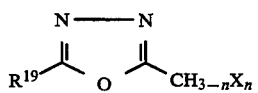 (VI)

wherein $R^{19}$ represents a substituted or unsubstituted alkyl, alkenyl, aryl or alkoxy group, a halogen atom, or a nitro or cyano group; X represents a halogen atom; and n is an integer of 1 to 3; compounds of Formula (VII):

$R^{20}$—Z—$CH_{2-m}X_m$—$R^{21}$ 

wherein $R^{20}$ represents a substituted or unsubstituted aryl group; $R^{21}$ represents a group represented by:

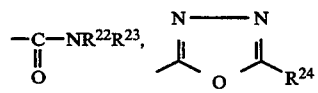

or a halogen atom; Z means —CO—, —CS— or —SO₂—; X is a halogen atom; $R^{22}$ and $R^{23}$ each represents a substituted or unsubstituted alkyl, alkenyl or aryl group; $R^{24}$ is identical to R′ defined above in connection with Formula (V); and m is 1 or 2; compounds of Formula (VIII):

(VIII)

wherein $R^{25}$ represents a substituted or unsubstituted aryl or heterocyclic group; $R^{26}$ represents a trihaloalkyl or trihaloalkenyl group having 1 to 3 carbon atoms; and p is 1, 2 or 3; carbonylmethylene heterocyclic compounds of Formula (IX) having trihalogenomethyl groups:

(IX)

wherein L represents a hydrogen atom or a group: —CO—$(R^{27})_n$ $(CX_3)$ m; M is a substituted or unsubstituted alkylene group; Q is a sulfur, selenium or oxygen atom or a dialkylmethylene, alken-1,2-ylene, 1,2-phenylene or N—$R^{28}$ group; M and Q may form a 3- or 4-membered ring; $R^{27}$ represents a carbocyclic or heterocyclic aryl group; R28 represents an alkyl, aralkyl or alkoxyalkyl group; X is a chlorine, bromine or iodine atom; q represents 0 or 1; if q is 0, r represents 1 and if q is 1, r represents 1 or 2; 4-halogeno-5-(halogenomethyl-phenyl)oxazole derivatives of Formula (X):

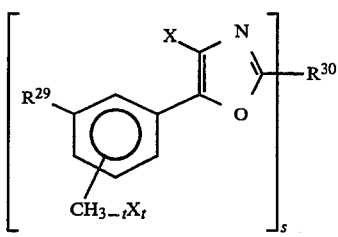

(X)

wherein X is a halogen atom; t is an integer ranging from 1 to 3; s is an integer ranging from 1 to 4; $R^{29}$ is a hydrogen atom or a group —$CH_{3-t}X_t$; $R^{30}$ is a substituted or unsubstituted unsaturated organic group having a valency s; and 2-(halogenomethyl-phenyl)-4-halogeno-oxazole derivatives of Formula (XI):

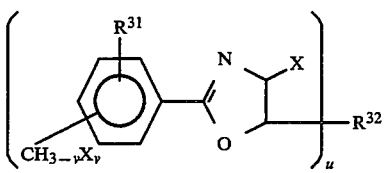

(XI)

wherein X is a halogen atom; v is an integer of 1 to 3; u is an integer of 1 to 4; $R^{31}$ is a hydrogen atom or a group: —$CH_{3-v}X_v$; and $R^{32}$ is a substituted or unsubstituted unsaturated organic group having a valency v.

Examples of compounds having carbon-halogen bonds are those disclosed in WAKABAYASHI et al., Bull. Chem. Soc. Japan, 1969, 42, p. 2924 such as 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis-(trichloromethyl)-s-triazine, 2-n-nonyl-4,6-bis-(trichloromethyl)-s-triazine and 2- (α,α,β-trichloroethyl)-4,6-bis((trichloromethyl)-s-triazine; compounds disclosed in U.K. Patent No. 1,388,492 such as 2-styryl-4,6-bis-(trichloromethyl)-s-triazine, 2-(p-methylstyryl)-4,6-bis(trichloromethyl)-s-triazine, 2-(p-methoxystyryl)-4,6-bis(trichloromethyl)-s-triazine and 2-(p-methoxystyryl)-4-amino-6-trichloromethyl-s-triazine; compounds disclosed in J.P. KOKAI No. Sho 53-133428=U.K. Pat. 1,602,903) such as 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-(2-ethoxyethyl)-naphtho-1-yl)-4,6-bis(trichloromethyl)-s-triazine, 2-(4,7-dimethoxy-naphtho-1-yl)-4,6-bis(trichloromethyl)-s-triazine and 2-(acenaphtho-5-yl)-4,6-bis(trichloromethyl)-s-triazine; compounds disclosed in German Patent No. 3,337,024(=U.S. Pat. No. 4,619,998) such as those represented by the following formulas:

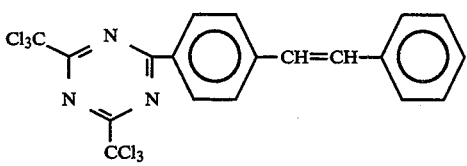

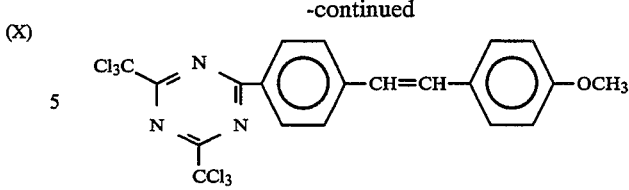

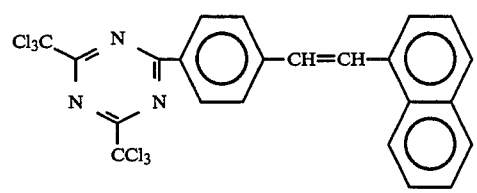

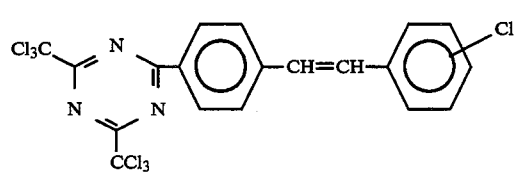

compounds represented by the following formulas:

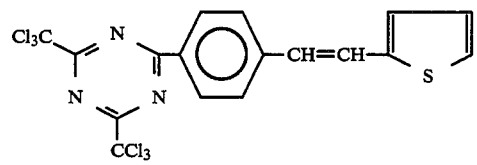

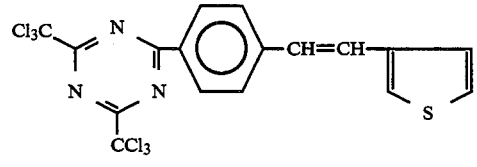

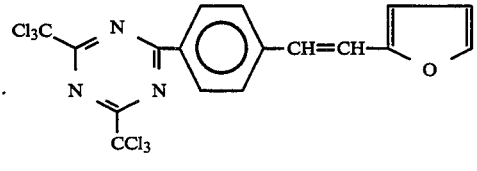

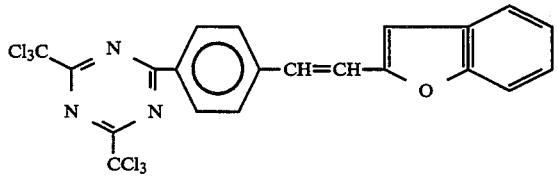

compounds disclosed in F. C. Schaefer et al., J. Org. Chem., 1964, 29, p. 1527 such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine and 2-methoxy-4-methyl-6-trichloromethyl-s-triazine; compounds disclosed in J.P. KOKAI No. Sho 62-58241(=U.S. Pat. No. 4,772,534) such as those represented by the following formulas:

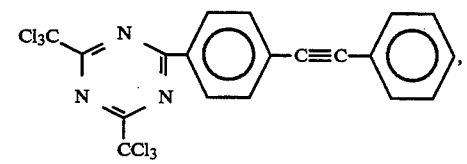
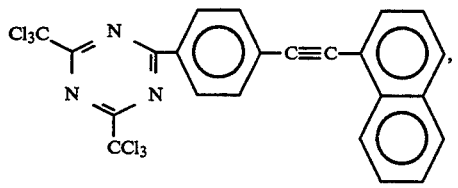
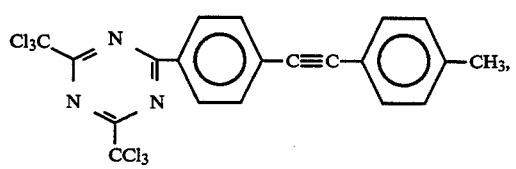
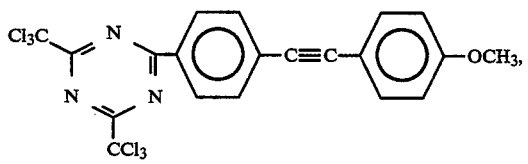
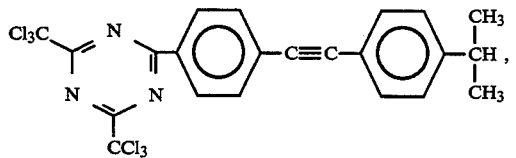
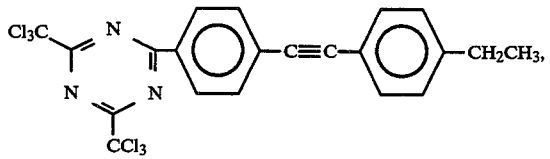
the following compounds which can easily be synthesized by those skilled in the art according to the method as disclosed in M. P. Hutt, E. F. Elslager and L. M. Werbel, Journal of Heterocyclic Chemistry, 1970, Vol. 7 (No. 3), infra p. 511:
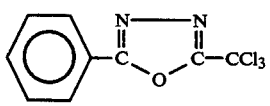
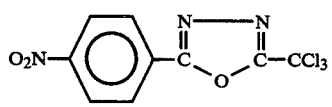
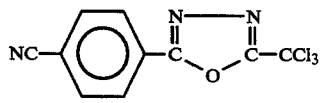
-continued
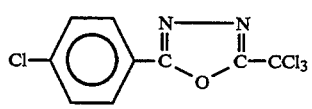
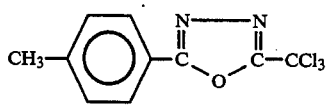
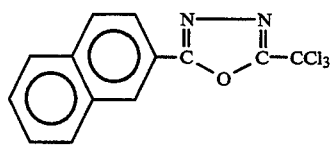
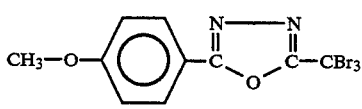
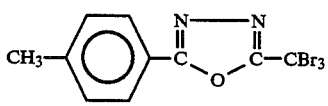
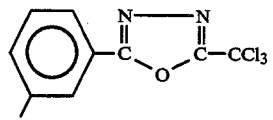
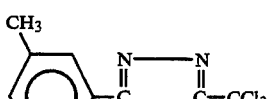
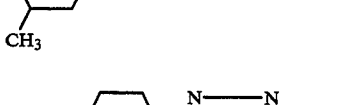
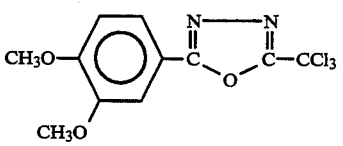
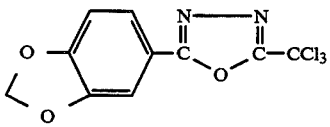
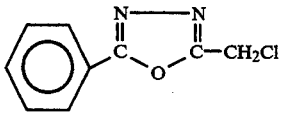
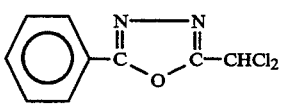

-continued
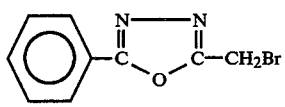
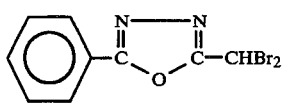
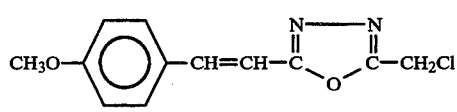
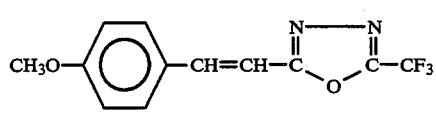
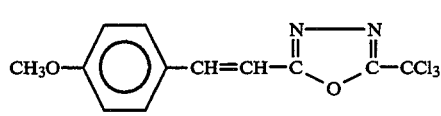
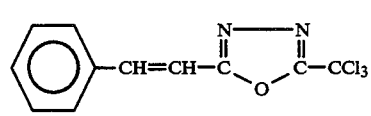
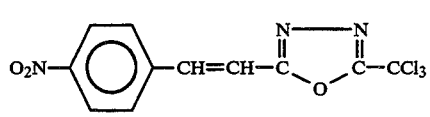
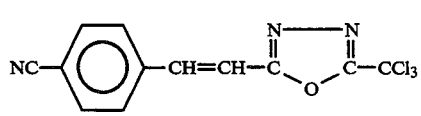
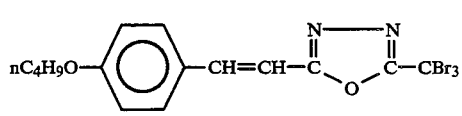
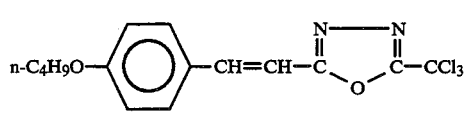
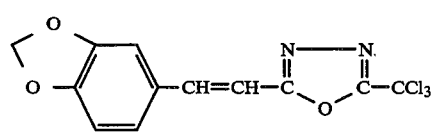
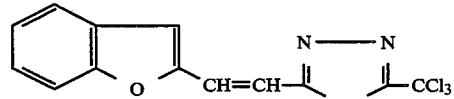
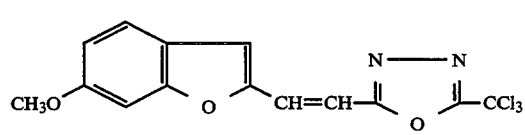
-continued
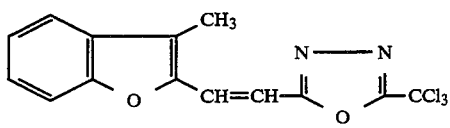
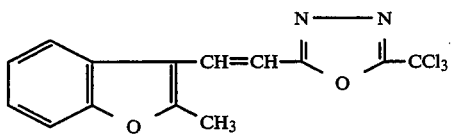
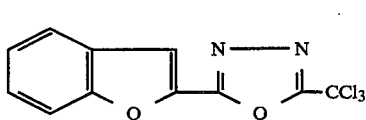
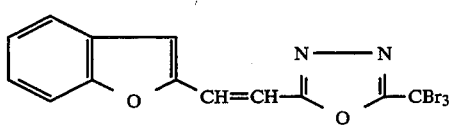
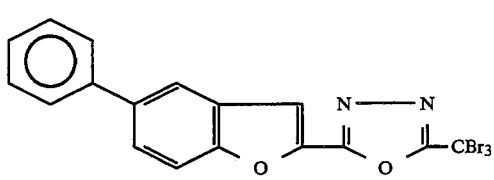
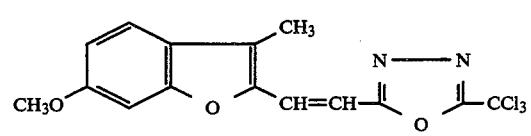
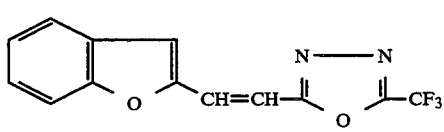
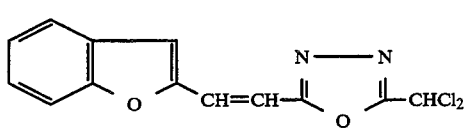
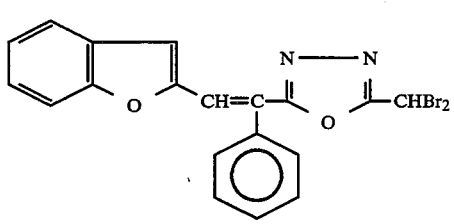
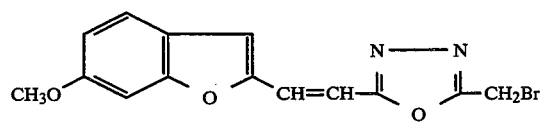
a series of compounds represented by the following formulas:

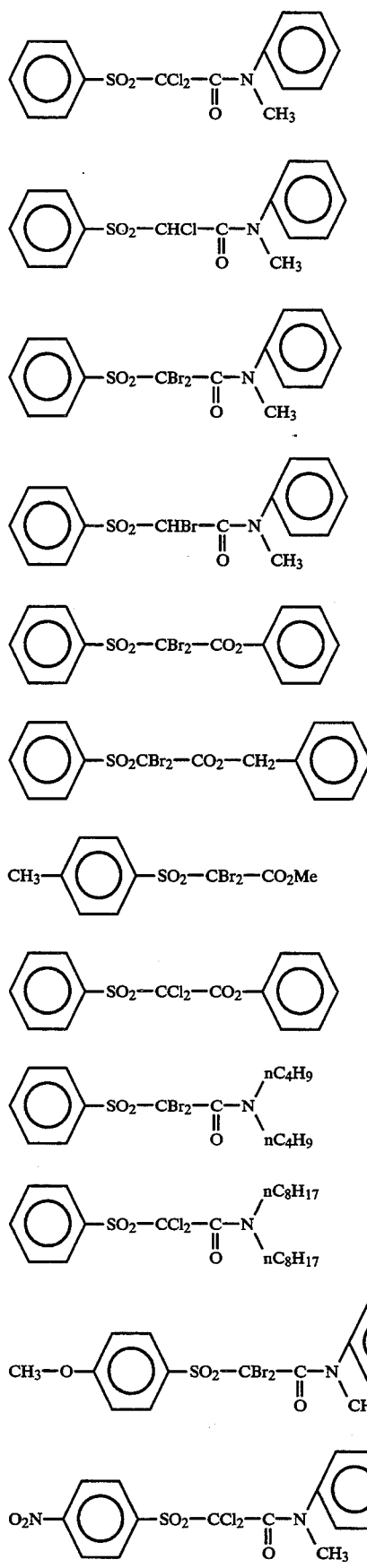

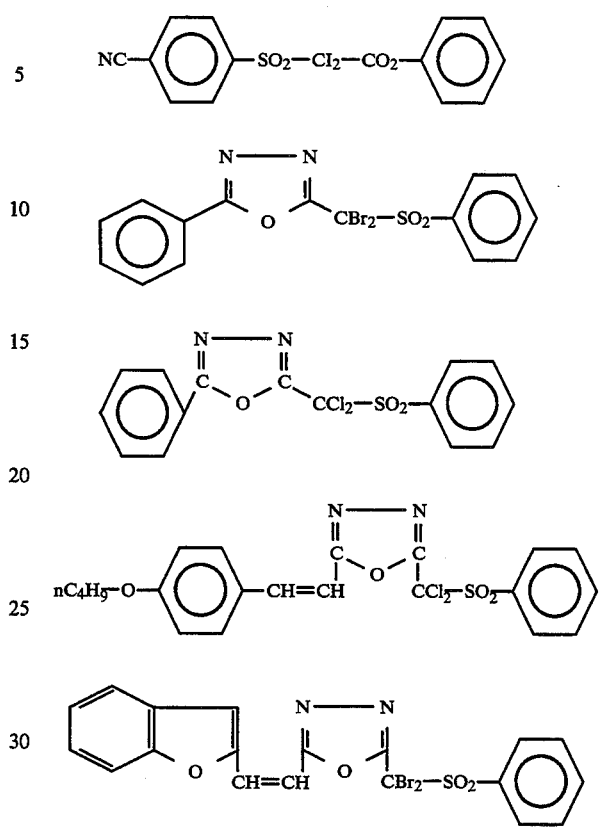

compounds disclosed in German Patent No. 2,641,100 such as 4-(4-methoxystyryl)-6-(3,3,3-trichloropropenyl)-2-pyrone and 4-(3,4,5-trimethoxystyryl)-6-trichloromethyl-2-pyrone; compounds disclosed in German Patent No. 3,333,450 such as those represented by the following general formula:

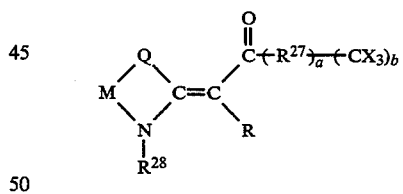

wherein $R^{28}$, M, R, a and $(CX_3)_b$ are, for instance, as follows:

|   | $R^{28}$ | m | R | a | $(CX_3)_b$ |
|---|---|---|---|---|---|
| 1 | $C_2H_5$ | 1,2-phenylene | H | 1 | 4-$CCl_3$ |
| 2 | $CH_6C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ | compounds disclosed in German Patent No. 3,021,590 such as those represented by the following general formula:

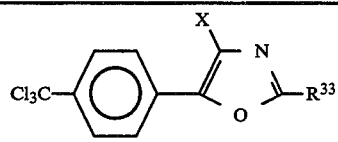

| R³³ | | X |
|---|---|---|
| 1 | 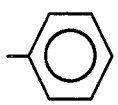 | Cl |
| 2 | 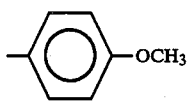 | Cl |
| 3 | 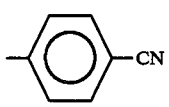 | Cl | and those represented by the following formulas:

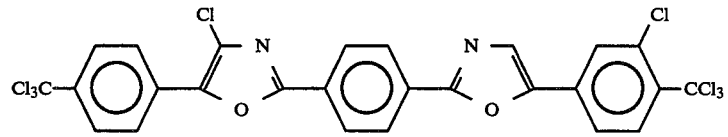

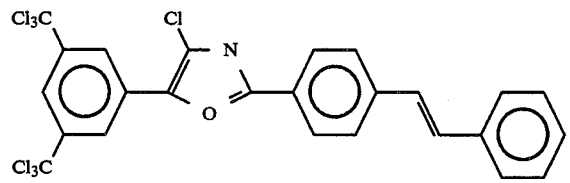

or compounds disclosed in German Patent No. 3,021,599 such as those represented by the following formulas:

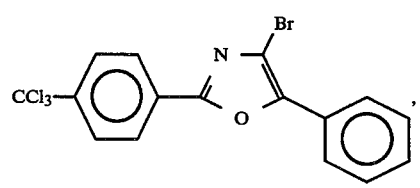

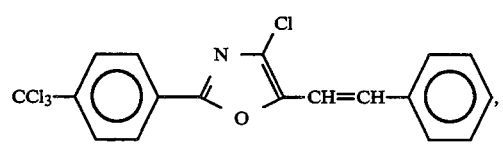

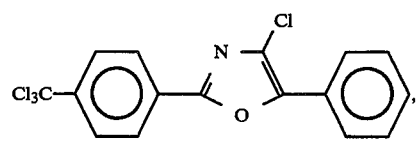

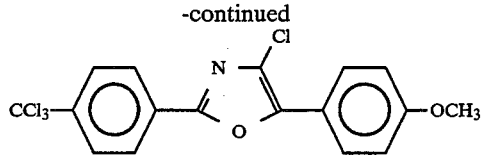

Examples of Component (iii)-(b), i.e., aromatic onium salts include aromatic onium salts of Group V, VI and VII elements of Periodic Table such as N, P, As, Sb, Bi, O, S, Se, Te or I, for instance, those disclosed in J.P. KOKOKU Nos. Sho 52-14277, Sho 52-14278 and Sho 52-14279. Specific examples thereof are those listed below:

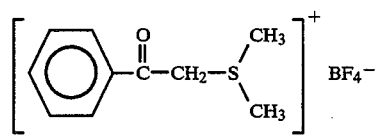

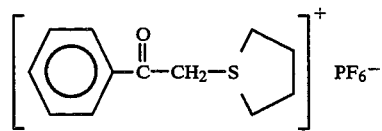

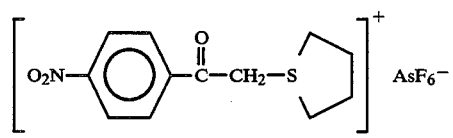

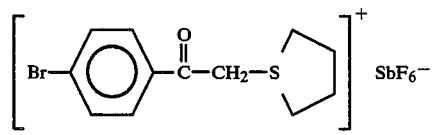

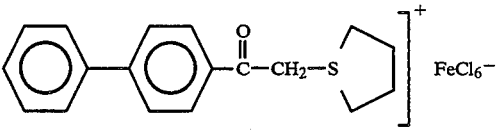

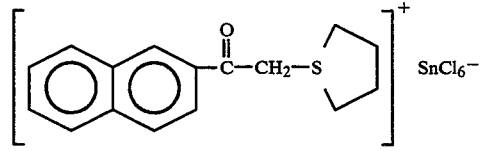

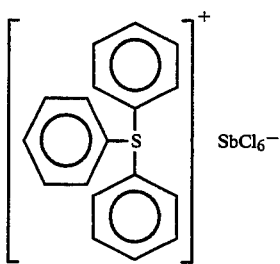 SbCl$_6^-$
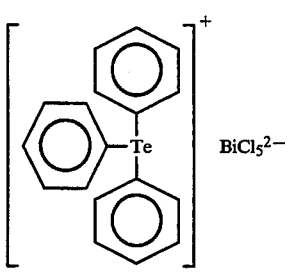 BiCl$_5^{2-}$
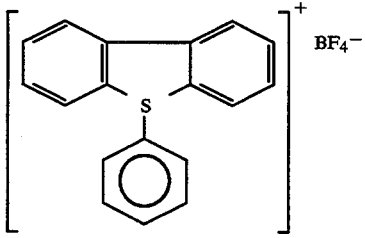 BF$_4^-$
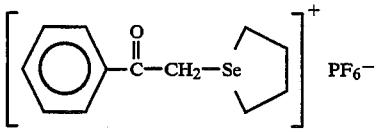 PF$_6^-$
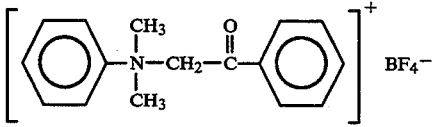 BF$_4^-$
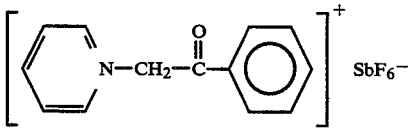 SbF$_6^-$
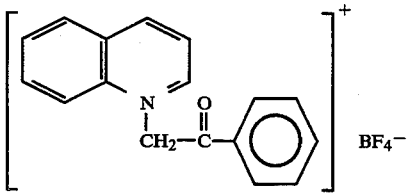 BF$_4^-$
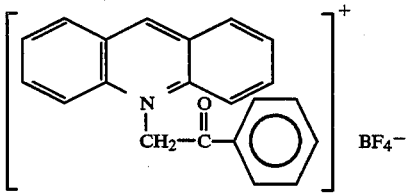 BF$_4^-$
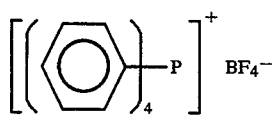 BF$_4^-$
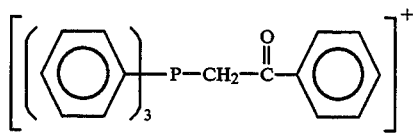 AsF$_6^-$
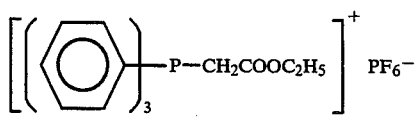 PF$_6^-$
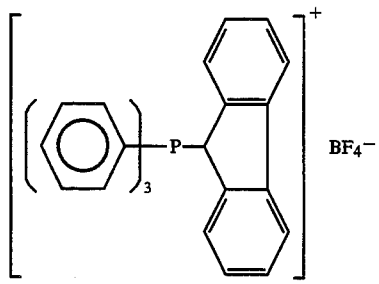 BF$_4^-$
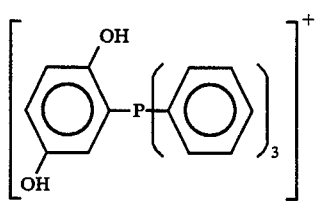 BF$_4^-$
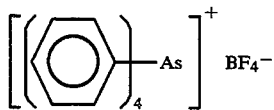 BF$_4^-$
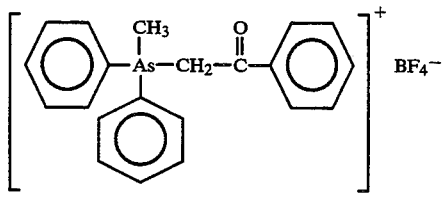 BF$_4^-$
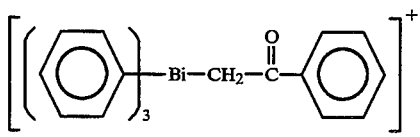 BF$_4^-$
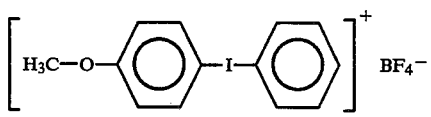 BF$_4^-$
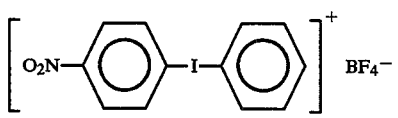 BF$_4^-$

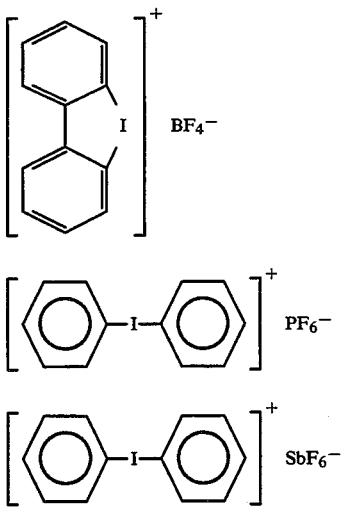

with BF₄ salts and PF₆ salts being preferred and BF₄ and PF₆ salts of aromatic iodonium compounds being more preferred.

Examples of Component (iii)-(c), i.e., organic peroxides include almost all of organic compounds each having at least one oxygen-oxygen bond in the molecule and specific examples thereof are methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy) cyclohexane, 2,2-bis(t-butylperoxy)butane, t-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimethyl-2,5-di(t-butylperoxy)hexyne-3, acetyl peroxide, isobutyl peroxide, octanoyl peroxide, decanoyl peroxide, lauroyl peroxide, 3,5,5-trimethylhexanoyl peroxide, peroxysuccinic acid, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxydicarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-butyl peroxybenzoate, di-t-butyl diperoxyisophthalate, 2,5-dimethyl-2,5-di(benzoylperoxy)hexane, t-butyl peroxymaleic acid, t-butyl peroxyisopropylcarbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl-di(t-butylperoxy-dihydrogen-diphthalate) and carbonyl-di(t-hexylperoxy-dihydrogen-diphthalate).

Among these compounds, preferred are peroxy esters such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone and di-t-butyl diperoxyisophthalate.

Examples of Component (iii)-(d), i.e., thio compounds used in the invention include those represented by the following general formula (II):

wherein R⁴ represents an alkyl or substituted or unsubstituted aryl group; R⁵ represents a hydrogen atom or an alkyl group, provided that R⁴ and R⁵ may represent groups of non-metallic atoms required for forming 5- to 7-membered ring which may comprise hetero atoms selected from oxygen, sulfur and nitrogen atoms.

The alkyl groups represented by R⁴ in Formula (II) are preferably those having 1 to 4 carbon atoms, the aryl groups are preferably those having 6 to 10 carbon atoms such as phenyl and naphthyl groups and the substituted aryl groups are the foregoing aryl groups which are substituted with halogen atoms such as chlorine atom, alkyl groups such as methyl group, and/or alkoxy groups such as methoxy and ethoxy groups.

The alkyl groups represented by R⁵ in Formula (II) are preferably methyl, ethyl, propyl and butyl groups.

Specific examples of the thio compounds represented by Formula (II) include those listed below.

| No. | R⁴ | R⁵ | No. | R⁴ + R⁵ |
|---|---|---|---|---|
| 1 | H | H | 15 | —(CH₂)₃— |
| 2 | H | CH₃ | 16 | —(CH₂)₂—S— |
| 3 | CH₃ | H | 17 | —CH(CH₃)—CH₂—S— |
| 4 | CH₃ | CH₃ | 18 | —CH₂—CH(CH₃)—S— |
| 5 | C₆H₅ | C₂H₅ | 19 | —C(CH₃)₂—CH₂—S— |
| 6 | C₆H₅ | C₄H₉ | 20 | —CH₂—C(CH₃)₂—S— |
| 7 | C₆H₄Cl | CH₃ | 21 | —(CH₂)₂—O— |
| 8 | C₆H₄Cl | C₄H₉ | 22 | —CH(CH₃)—CH₂—O— |
| 9 | C₆H₄—CH₃ | C₄H₉ | 23 | —C(CH₃)₂—CH₂—O— |
| 10 | C₆H₄—OCH₃ | CH₃ | 24 | —CH=CH—N(CH₃)— |
| 11 | C₆H₄—OCH₃ | C₂H₅ | 25 | —(CH₂)₃—S— |
| 12 | C₆H₄—OC₂H₅ | CH₃ | 26 | —(CH₂)₂CH(CH₃)—S— |
| 13 | C₆H₄—OC₂H₅ | C₂H₅ | 27 | —(CH₂)₃—O— |
| 14 | C₆H₄—OCH₃ | C₄H₉ | 28 | —(CH₂)₅— |
| | | | 29 | —C₆H₄—O— |
| | | | 30 | —N=C(SCH₃)—S— |
| | | | 31 | —C₆H₄—NH— |
| | | | 32 | 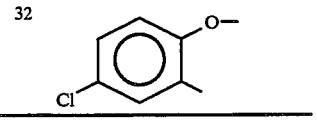 |

Examples of component (iii)-(e), i.e., hexaaryl biimidazoles used in the present invention include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole and 2,2'-bis(o-trifluoromethylphenyl)-4,4',5,5'-tetraphenyl biimidazole.

Examples of Component (iii)-(f), i.e., ketoxime esters used in the invention include 3-benzoyloxyiminobutan-2-one, 3-acetoxyiminobutan-2-one, 3-propionyloxyiminobutan-2-one, 2-acetoxyiminopentan-3-one, 2- acetoxyimino-1-phenylpropan-1-one, 2-benzoyloxyimino-1-phenylpropan-1-one, 3-p-toluene-sulfonyloxyiminobutan-2-one and 2-ethoxycarbonyloxyimino-1-phenylpropan-1-one.

Examples of compounds used in the invention as Component (iii)-(g) include those represented by the following general formula (III):

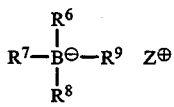
(III)

wherein $R^6$, $R^7$, $R^8$ and $R^9$ may be the same or different and each represents a substituted or unsubstituted alkyl, aryl, alkenyl, alkynyl or heterocyclic group and at least two of $R^6$, $R^7$, $R^8$ and $R^9$ may be bonded to form a ring structure, provided that at least one of them represents an alkyl group; and $Z^+$ represents an alkali metal or quaternary ammonium cation.

The alkyl groups represented by the foregoing $R^6$ to $R^9$ are linear, branched and cyclic ones preferably having 1 to 18 carbon atoms and specific examples thereof are methyl, ethyl, propyl, isopropyl, butyl, pentyl, hexyl, octyl, stearyl, cyclobutyl, cyclopentyl and cyclohexyl groups. The substituted alkyl groups are preferably alkyl groups listed above which are substituted with halogen atoms (such as —Cl and —Br), cyano, nitro, aryl groups (preferably phenyl), hydroxyl groups: —$NR^{34}R^{35}$ (wherein $R^{34}$ and $R^{35}$ each independently represents an alkyl group having 1 to 14 carbon atoms or an aryl group), —$COOR^{36}$ (wherein $R^{36}$ represents a hydrogen atom or an alkyl group having 1 to 14 carbon atoms or an aryl group), —$OCOR^{37}$ and/or —$OR^{37}$ ($R^{37}$ is an alkyl group having 1 to 14 carbon atoms or an aryl group).

The aryl groups represented by the foregoing $R^6$ to $R^9$ are those comprising 1 to 3 rings such as phenyl and naphthyl groups and the substituted aryl groups include the foregoing aryl groups which are substituted with alkyl groups having 1 to 14 carbon atoms and/or the substituents listed above in connection with the substituted alkyl groups.

The alkenyl groups represented by the foregoing $R^6$ to $R^9$ are linear, branched and cyclic ones having 2 to 18 carbon atoms and the substituted alkenyl groups include the foregoing alkynyl groups which are substituted with the substituents listed above in connection with the substituted alkyl groups.

The alkynyl groups represented by the foregoing $R^6$ to $R^9$ are linear and branched ones having 2 to 18 carbon atoms and the substituted alkynyl groups include the foregoing alkynyl groups which are substituted with the substituents listed above in connection with the substituted alkyl groups.

The heterocyclic groups represented by the foregoing $R^6$ to $R^9$ are at least 5-membered, preferably 5- to 7-membered heterocyclic groups having at least one member selected from the group consisting of N, S and O. The heterocyclic group may have a condensed ring. Further, the substituted heterocyclic groups may be the foregoing heterocyclic groups which are substituted with the substituents listed above in connection with the substituted aryl groups.

$Z^+$ include, for instance, $Na^+$, $K^+$, $N^+(CH_3)_4$, $N^+(C_2H_5)_4$ and $N^+(n-C_4H_9)_4$.

Specific examples of Component (iii)-(g), i.e., compounds represented by Formula (III) include those disclosed in U.S. Pat. Nos. 3,567,453 and 4,343,891 and European Patent Nos. 109,772 and 109,773 and those listed below:

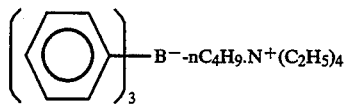
(iii)-1

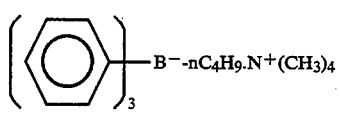
(iii)-2

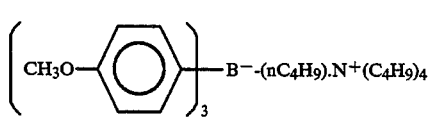
(iii)-3

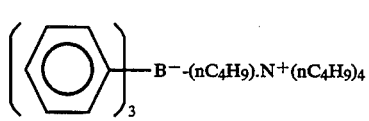
(iii)-4

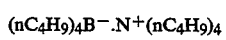
(iii)-5

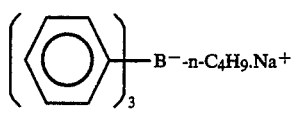
(iii)-6

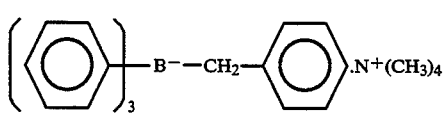
(iii)-7

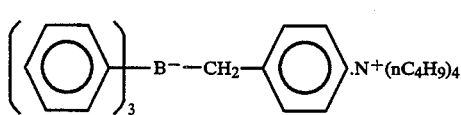
(iii)-8

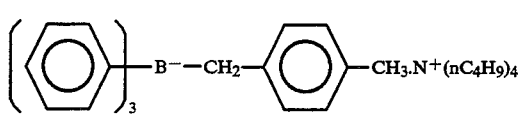
(iii)-9

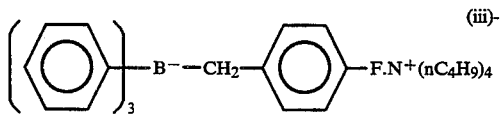
(iii)-10

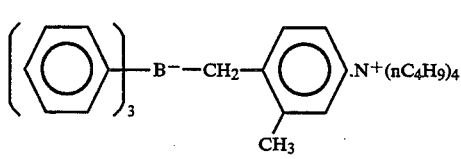
(iii)-11

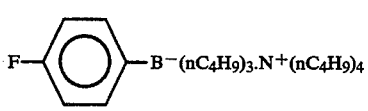
(iii)-12

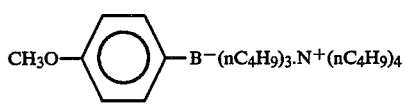 (iii)-13

The compounds represented by the following general formula (IV) (as Component (iv)) can optionally be added to the photopolymerizable composition of the present invention to further enhance the sensitivity thereof.

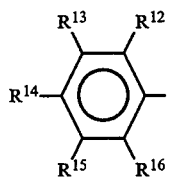 (IV)

In formula (IV), $R^{10}$ and $R^{11}$ each represents a hydrogen atom or an alkyl group or $R^{10}$ and $R^{11}$ may be bonded to form an alkylene group and Ar means an aromatic group selected from those represented by the following general formulas:

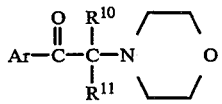

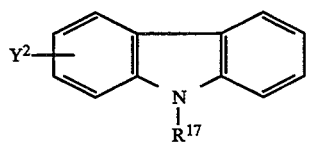

wherein $R^{12}$, $R^{13}$, $R^{14}$, $R^{15}$ and $R^{16}$ may be the same or different and each represents a hydrogen or halogen atom or an alkyl, alkenyl, aryl, substituted aryl, hydroxyl, alkoxy, substituted alkoxy, —S—$R^{18}$, —SO—$R^{18}$ or —SO$_2$$R^{18}$ group, provided that at least one of $R^{12}$, $R^{13}$, $R^{14}$, $R^{15}$ and $R^{16}$ represents —S—$R^{18}$, —SO—$R^{18}$ or —SO$_2$$R^{18}$; $R^{18}$ represents an alkyl or alkenyl group; and $R^{17}$ represents a hydrogen atom or an alkyl or acyl group. $Y^2$ represents a hydrogen atom or a group:

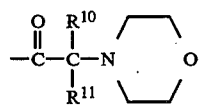

wherein $R^{10}$ and $R^{11}$ are the same as those defined above.

The alkyl groups represented by the foregoing $R^{10}$, $R^{11}$, $R^{17}$ and $R^{18}$ in Formula (IV) include, for instance, those having 1 to 20 carbon atoms such as methyl, ethyl and propyl groups. The alkylene groups formed through the bonding of $R^{10}$ and $R^{11}$ are, for instance, tetramethylene and pentamethylene. The alkyl groups of $R^{12}$ to $R^{16}$ in Ar are, for instance, those having 1 to 4 carbon atoms and the alkenyl groups thereof are, for instance, those having 3 to 12 carbon atoms. Moreover, the aryl groups represented by $R^{12}$ to $R^{16}$ include, for instance, phenyl group and the alkoxy group include, for instance, those having 1 to 4 carbon atoms.

The alkenyl groups represented by $R^{18}$ are, for example, those having 3 to 12 carbon atoms. The acyl groups represented by $R^{17}$ are, for instance, acetyl, propionyl and acryloyl groups.

Specific examples of the compounds represented by Formula (IV) (Component (iv)) are listed below:

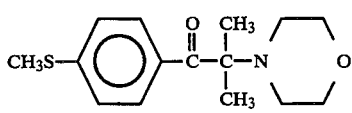 (iv)-1

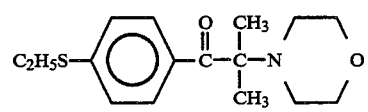 (iv)-2

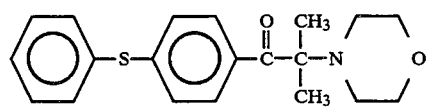 (iv)-3

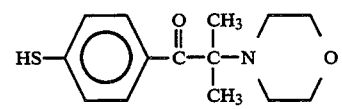 (iv)-4

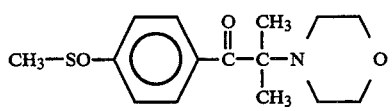 (iv)-5

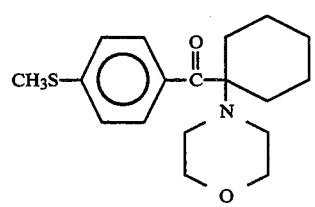 (iv)-6

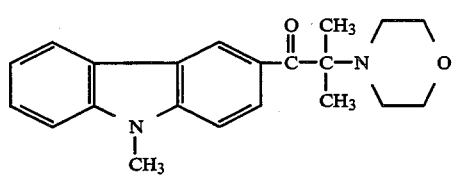 (iv)-7

-continued

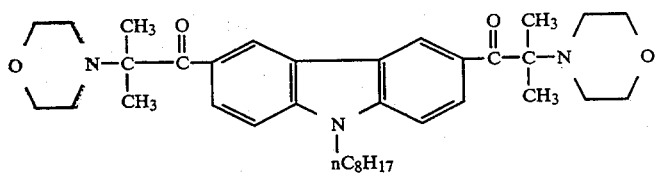
(iv)-8

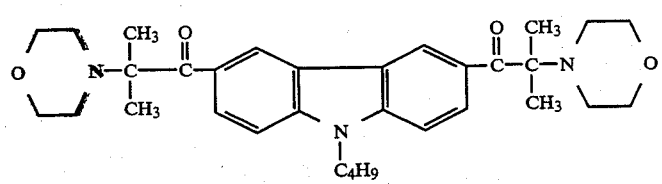
(iv)-9

Among these, preferred are (iv)-1, (iv)-2, (iv)-8 and (iv)-9.

In the composition of the present invention, the content of these photopolymerization initiator systems (Components (ii) and (iii) and optional Component (iv)) is in general very low, while if the systems are used in an inadequately large amount, undesirable phenomena such as blocking of effective light rays would occur. Thus, the amount of the photopolymerization initiator system preferably ranges from 0.01 to 60%, more preferably 1 to 30% on the basis of the total weight of the photopolymerizable ethylenically unsaturated compound and the optional linear organic polymer.

Regarding the relative amounts of Component (ii) and Component (iii) which are used in the composition of the invention as a photopolymerization initiator, the amount of Component (iii) preferably ranges from 0.05 to 30 parts by weight, more preferably 0.1 to 10 parts by weight and most preferably 0.2 to 5 parts by weight per one part by weight of the organic dye, i.e., Component (ii).

Moreover, if Component (iv) is simultaneously used, the amount of Component (iv) preferably ranges from 0.01 to 50 parts by weight, more preferably 0.02 to 20 parts by weight and most preferably 0.05 to 10 parts by weight per one part by weight of the organic dye, i.e., Component (ii).

The photopolymerizable composition of the present invention preferably comprises a linear organic polymer as a binder (Component (v)). Such "linear organic polymers" are not restricted to specific ones so far as they can be compatible with the photopolymerizable ethylenically unsaturated compound. Preferred are linear organic polymers which are soluble in or swellable with water or a weak alkaline aqueous solution to thus render the composition water- or weak alkaline water-developable. The linear organic polymers serve as film-forming agents for the composition, but are also selected and used depending on the kinds of developers used such as water, weak alkaline water and developers comprising organic solvents. If water-soluble organic polymers are, for instance, used, the resulting composition can be developed with water. Examples of such water-soluble linear organic polymers are addition polymers carrying carboxyl groups on the side chains such as those disclosed in J.P. KOKAI Nos. Sho 59-44615, Sho 54-92723, Sho 59-53836 and Sho 59-71048 and J.P. KOKOKU Nos. Sho 54-34327, Sho 58-12577 and Sho 54-25957, more specifically methacrylic acid copolymers, acrylic acid copolymers, itaconic acid copolymers, crotonic acid copolymers, maleic acid copolymers and partially esterified maleic acid copolymers.

Other useful examples of such polymers include acidic cellulose derivatives carrying carboxyl groups on the side chains; and addition polymers having hydroxyl groups to which cyclic acid anhydrides are added.

Particularly preferred are benzyl (meth)acrylate/(meth)acrylic acid/optional other addition polymerizable vinyl monomer copolymer and allyl (meth)acrylate/(meth)acrylic acid/optional other addition polymerizable vinyl monomer copolymer.

Other useful water-soluble linear organic polymers include, for instance, polyvinyl pyrrolidone and polyethylene oxide. Further alcohol-soluble polyamides, polyethers of 2,2-bis(4-hydroxyphenyl)propane and epichlorohydrin or the like are also useful for improving the strength of the resulting hardened film.

These linear organic polymers may be added to the composition in any amount, but any good result cannot be anticipated if the polymers are used in an amount of more than 90% by weight. For instance, the strength of the resulting images are impaired. For this reason, the content thereof preferably ranges from 30 to 85% on the basis of the total weight of the composition. Moreover, the weight ratio of the photopolymerizable ethylenically unsaturated compound to the linear organic polymer preferably ranges from 1/9 to 7/3 and more preferably 3/7 to 5/5.

In addition to the foregoing essential components, the photopolymerizable composition of the invention may comprise a small amount of a heat polymerization inhibitor for preventing unnecessary heat polymerization of the polymerizable ethylenically unsaturated compounds during preparation and/or storage of the light-sensitive composition. Examples of useful heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and primary cerium salt of N-nitrosophenylhydroxylamine. The amount of the heat polymerization inhibitor is in the range of from about 0.01 to about 5% on the basis of the total weight of the composition.

Moreover, a higher fatty acid or its derivative such as behenic acid and behenic acid amide can optionally be added to the composition to prevent the polymerization-inhibitory effect of oxygen. The higher fatty acid or its derivative are localized in the surface area of the resulting light-sensitive film during drying the coated film. The amount of the higher fatty acid or its derivative ranges from about 0.5 to about 10%.

The composition may further comprise a dye or pigment for coloring the resulting light-sensitive layer. The amount thereof ranges from about 0.5 to about 5%. In addition, it may likewise comprise inorganic fillers or other known additives for improving physical properties of the resulting hardened film.

The photopolymerizable composition of the invention is dissolved in a variety of organic solvents and then applied onto a proper substrate. Examples of organic solvents are acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate and ethyl lactate. These solvents may be used alone or in combination. The solid content of the coating solution suitably ranges from 2 to 50% by weight.

The amount of the composition to be applied preferably ranges from about 0.1 to about 10 g/m$^2$ and more preferably 0.5 to 5 g/m$^2$ (weighed after drying). The coating solution may be applied by any coating method such as whirler coating, wire bar coating, dip coating, air knife coating, roll coating, blade coating, curtain coating and spray coating methods. The layer of the photopolymerizable composition thus formed is dried by any conventionally known method which accompanies heating.

Substrates on which the composition is applied are dimensionally stable plate-like materials. Examples of such dimensionally stable plate-like materials are paper, paper laminated with plastics (such as polyethylene, polypropylene or polystyrene), metal plates such as aluminum (inclusive of alloys thereof), zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and paper and plastic films laminated with foils of the foregoing metals or on which the foregoing metals are vapor-deposited. Among these substrates, aluminum plates are particularly preferred because of high dimensional stability and low price. Preferred also include, for instance, composite sheets comprising polyethylene terephthalate films on which aluminum sheets are adhered, as disclosed in J.P. KOKOKU No. Sho 48-18327.

Substrates having metallic surfaces, in particular aluminum surfaces are preferably surface-treated by, for instance, graining, dipping in an aqueous solution of sodium silicate, potassium fluorozirconate or a phosphate, and/or anodization.

The aluminum plate is preferably treated by dipping in an aqueous solution of sodium silicate after graining. The aluminum plate which is anodized and then dipped in an aqueous solution of an alkali metal silicate as disclosed in J.P. KOKOKU No. Sho 47-5125 can preferably be used in the invention. The foregoing anodization treatment is performed by passing an electric current through the aluminum plate serving as an anode in an electrolyte such as aqueous or non-aqueous solutions of inorganic acids (e.g., phosphoric acid, chromic acid, sulfuric acid and boric acid) and organic acids (e.g., oxalic acid and sulfamic acid) and mixture thereof.

Silicate electrodeposition as disclosed in U.S. Patent No. 3,658,662 is also effective as a surface treatment of the aluminum plate.

Useful surface-treatments further include combinations of electrolytic graining and the foregoing anodization and sodium silicate treatment as disclosed in J.P. KOKOKU No. Sho 46-27481 and J.P. KOKAI Nos. Sho 52-58602 and Sho 52-30503.

The aluminum plates which are in order mechanically surface-roughened, chemically etched, electrolytically grained, anodized and then treated with sodium silicate are also preferably used in the invention.

After these treatments, an underlying coating is optionally and preferably applied onto the aluminum plates (substrates having aluminum surfaces). Examples of the underlying coating include polyvinylphosphonic acid, polymers and copolymers having sulfonate residues on the side chains, polyacrylic acid, water-soluble metal salts such as zinc borate, yellow dyes or amine salts.

These hydrophilization treatments are performed for not only hydrophilizing the surface of substrates but also preventing any detrimental reaction between the substrate and the photopolymerizable composition subsequently applied thereto and improving the adhesion of the light-sensitive layer to the substrate.

A protective layer having high oxygen barrier properties may optionally be applied onto the layer of the photopolymerizable composition applied onto the substrate for preventing the polymerization-inhibitory effect of oxygen in the air. Examples of materials for such protective layers are polymers having excellent oxygen barrier properties such as polyvinyl alcohol, in particular those having a degree of saponification of not less than 99% and acidic celluloses. Methods for applying these protective layers are detailed in, for instance, U.S. Pat. No. 3,458,311 and J.P. KOKOKU No. Sho 55-49729.

Moreover, the photopolymerizable composition of the present invention can be used in the usual photopolymerization reaction. Further, it can be used in various fields such as formation of printing plates and photoresists used in the preparation of printed circuit boards. In particular, good results can be obtained when the composition of the invention is used as a light-sensitive material sensitive to visible lasers such as Ar+ lasers since the composition has a wide spectral sensitivity extending over visible light region and high sensitivity.

The light-sensitive material obtained from the composition of the invention is imagewise exposed to light and then developed with a developer to remove the non-exposed portion and to thus give desired images.

Light sources for actinic light rays used in the imagewise exposure include, for instance, a mercury lamp, a metal halide lamp, a xenon lamp, a chemical lamp and a carbon arc lamp as well as those for radiant rays such as electron beam, X-rays, ion beam and far ultraviolet rays. Light sources for photoresist preferably include g-rays, i-rays and Deep-UV light rays. In addition, the scanning exposure with high density energy beams (such as laser beams or electron beams) can likewise be used in the invention. Examples of such lasers are helium.neon laser, argon laser, krypton laser, helium.cadmium laser and KrF excimer laser.

Preferred examples of developers used in the preparation of lithographic printing plates from the photopolymerizable composition of the invention are those described in J.P. KOKOKU No. Sho 57-7427 and more specifically aqueous solutions of inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, and organic alkaline agents such as monoethanolamine and diethanolamine. The concentration of these alkaline agents in general ranges from 0.1 to 10% by weight and preferably 0.5 to 5% by weight.

The alkaline aqueous solution as the developer may optionally comprise a surfactant and/or an organic solvent such as benzyl alcohol, 2-phenoxyethanol or 2-butoxyethanol in a small amount. Specific examples thereof are those disclosed in, for instance, U.S. Pat. Nos. 3,375,171 and 3,615,480. Other preferred developers include those disclosed in, for instance, J.P. KOKAI Nos. Sho 50-26601 and Sho 58-54341 and J.P. KOKOKU Nos. Sho 56-39464 and Sho 56-42860.

The photopolymerizable composition of the present invention is highly sensitive to wide variety of actinic light rays extending from ultraviolet rays to visible light rays. Therefore, the light-sensitive layer obtained from the composition can be exposed to light from a variety of sources such as ultrahigh pressure, high pressure, intermediate pressure and low pressure mercury lamps, chemical lamps, carbon arc lamps, xenon lamps, metal halide lamps, visible and ultraviolet light laser lamps, fluorescent lightings, tungsten lamps and sunlight.

The present invention will be explained in more detail with reference to the following non-limitative working Examples and the effects practically achieved by the invention will also be discussed in comparison with Comparative Examples.

Examples 1 to 48 and Comparative Examples 1 to 15

An aluminum plate having a thickness of 0.30 mm was surface-grained with a nylon brush and an aqueous suspension of pumice stone and then sufficiently washed with water. Then the plate was etched by dipping in a 10% aqueous solution of sodium hydroxide at 70° C. for 60 seconds, followed by washing with running water, neutralization and washing with a 20% nitric acid solution and water-washing. The aluminum plate thus treated was electrolytically surface-roughened in a 1% aqueous solution of nitric acid at a $V_A$ of 12.7 V such that the quantity of electricity at the anode time was 160 coulomb/dm$^2$ using a sinusoidal alternating waved current. At this stage, the surface roughness thereof was determined to be 0.6μ (expressed in terms of Ra unit). Subsequently, the aluminum plate was immersed in a 30% sulfuric acid aqueous solution at 55° C. for 2 minutes to desmut the plate and then anodized at a current density of 2 A/dm$^2$ in a 20% aqueous solution of sulfuric acid so that the thickness of the resulting anodized layer was equal to 2.7 g/m$^2$.

A light-sensitive composition having the following composition was applied onto the aluminum plate thus treated and then dried at 80° C. for 2 minutes to give a light-sensitive layer, the amount of the composition applied being 1.4 g/m$^2$ (weighed after drying).

| | |
|---|---|
| Trimethylolpropane tri(acryloyloxypropyl) ether | 2.0 g |
| Allyl methacrylate/methacrylic acid copolymer (copolymerization molar ratio = 80/20) | 2.0 g |
| Photopolymerization initiator | X g |
| Fluorine atom-containing nonionic surfactant | 0.03 g |
| Methyl ethyl ketone | 20 g |
| Propylene glycol monomethyl ether acetate | 20 g |

A 3% by weight aqueous solution of a polyvinyl alcohol (degree of saponification = 86.5 to 89 mole %; degree of polymerization = 1,000) was applied onto the light-sensitive layer in an amount of 2 g/m$^2$ (weighed after drying) and then dried at 100° C. for 2 minutes. Test on the sensitivity of the light-sensitive material thus obtained was performed using a visible light.

The visible light was a monochromatic light rays obtained by passing light rays from a xenon lamp through a Kenko Optical Filter BP-49. The determination of the sensitivity was performed using Fuji PS Step Guide (available from Fuji Photo Film Co., Ltd.; Step Tablet having 15 steps and a transmission optical density difference between the neighbouring two steps of 0.15, with the initial optical density being 0.05). The sensitivity was expressed in terms of the number of clear steps observed when the light-sensitive layer was exposed to light at an illuminance on the film surface of 0.0132 mW/cm$^2$ for 80 seconds.

The development was performed by immersing the imagewise exposed light-sensitive plate in the following developer for 30 seconds.

| | |
|---|---|
| 1K Potassium silicate | 30 g |
| Potassium hydroxide | 15 g |
| H$_{25}$C$_{12}$—C$_6$H$_4$—O—C$_6$H$_4$—SO$_3$Na | 3 g |
| Water | 1000 g |

The following compounds were used as photopolymerization initiators. The results of the sensitivity determination obtained when combinations of the photopolymerization initiators were changed are listed in the following Table 1.

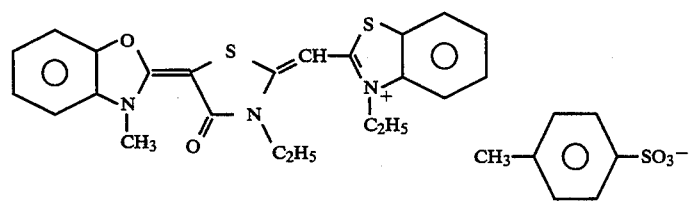

(ii)-22

-continued
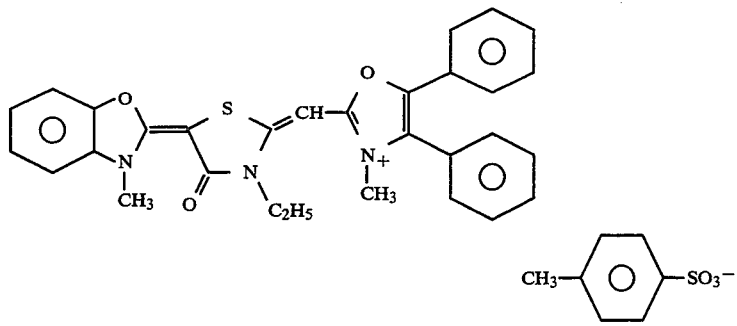
(ii)-19
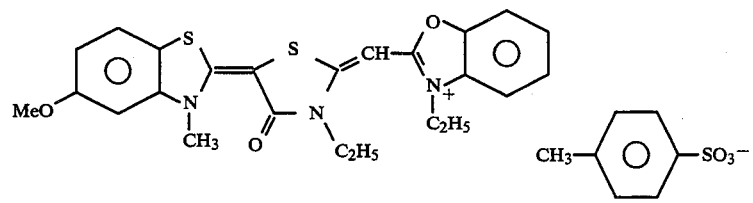
(ii)-15
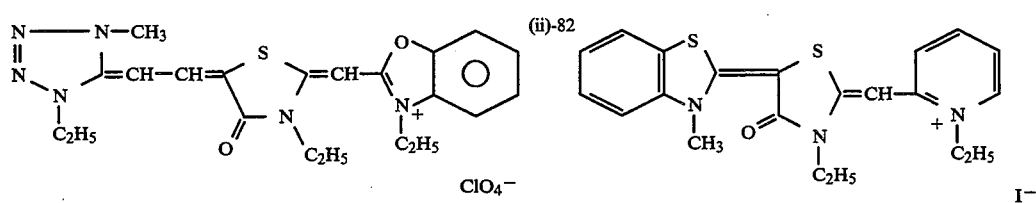
(ii)-82 (ii)-8
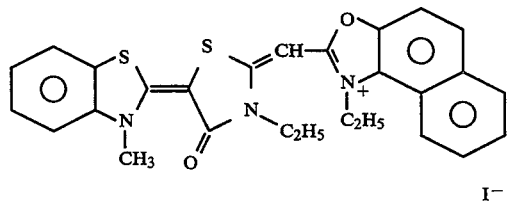
(ii)-9
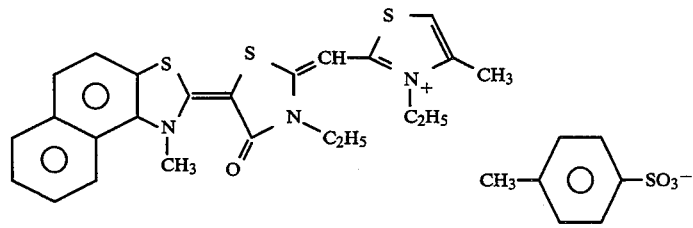
(ii)-17
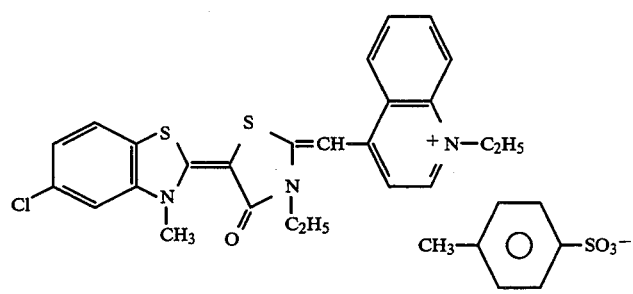
(ii)-37

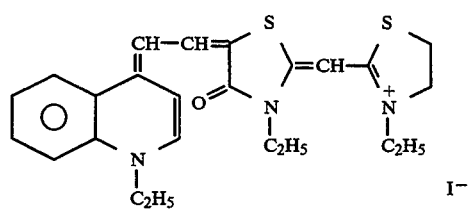 (ii)-66
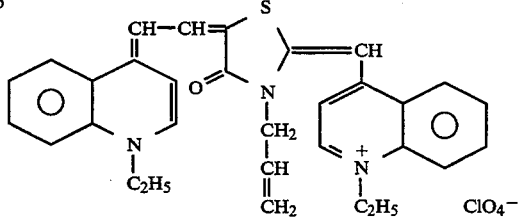 (ii)-69
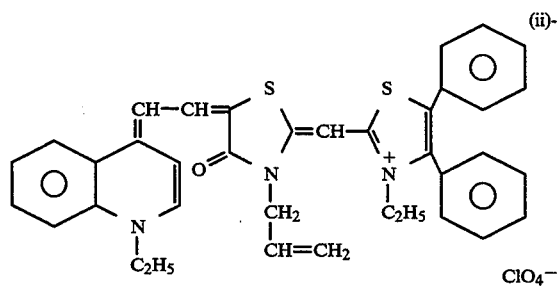 (ii)-70
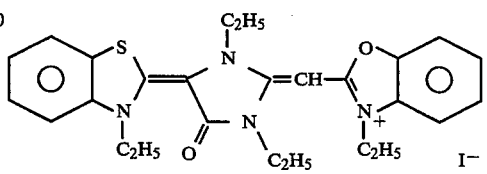 (ii)-73
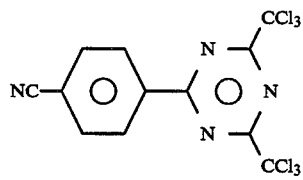 (iii)-A
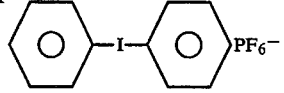 (iii)-B
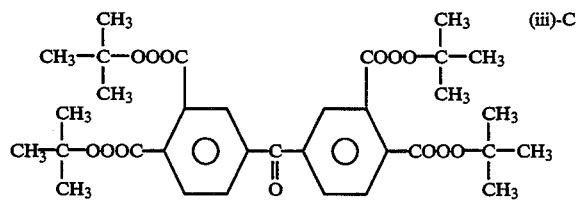 (iii)-C
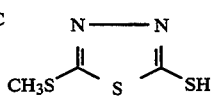 (iii)-D
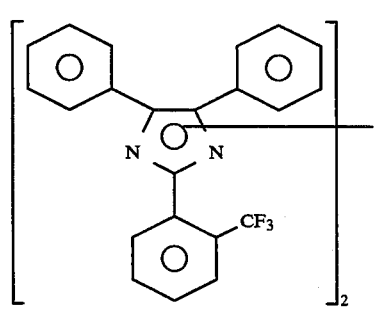 (iii)-E
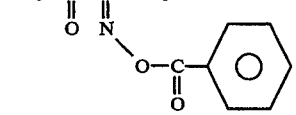 (iii)-F
(n-C$_4$H$_9$)$_4$N$^+$ Ph$_3$B$^-$ n-C$_4$H$_9$ (iii)-G
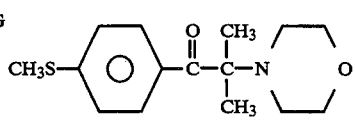 (iv)-A
TABLE 1
| Ex. No. | Compound (ii) (amount g) | Compound (iii) (amount g) | Compound (iv) (amount g) | Sensitivity (*1) |
|---|---|---|---|---|
| 1 | (ii)-22(0.071) | (iii)-A(0.1) | — | 5 |
| 2 | " | (iii)-B(0.1) | — | 2 |
| 3 | " | (iii)-C(0.16) | — | 1 |
| 4 | " | (iii)-D(0.039) +(iii)-E(0.16) | — | 2 |
| 5 | " | (iii)-F(0.05) | — | 1 |
| 6 | " | (iii)-G(0.065) | — | 2 |
| 7 | " | (iii)-A(0.1) +(iii)-G(0.065) | — | 7 |
| 8 | " | (iii)-B(0.1) +(iii)-G(0.065) | — | 5 |
| 9 | " | (iii)-A(0.1) +(iii)-G(0.065) | (iv)-A(0.1) | 6 |
| 10 | " | (iii)-G(0.065) | " | 3 |
| 11 | (ii)-19(0.085) | (iii)-A(0.1) | — | 8 |
| 12 | " | (iii)-B(0.1) | — | 5 |
| 13 | " | (iii)-C(0.16) | — | 2 |
| 14 | " | (iii)-D(0.039) +(iii)-E(0.16) | — | 4 |
| 15 | " | (iii)-F(0.05) | — | 2 |
| 16 | " | (iii)-G(0.065) | — | 2 |
| 17 | " | (iii)-A(0.1) +(iii)-G(0.065) | — | 10 |
| 18 | " | (iii)-B(0.1) +(iii)-G(0.065) | — | 7 |

TABLE 1-continued

| | | | | |
|---|---|---|---|---|
| 19 | " | (iii)-A(0.1) | (iv)-A(0.1) | 9 |
| 20 | " | (iii)-G(0.065) | " | 3 |
| 21 | (ii)-15(0.078) | (iii)-A(0.1) | — | 10 |
| 22 | " | (iii)-B(0.1) | — | 6 |
| 23 | " | (iii)-C(0.16) | — | 4 |
| 24 | " | (iii)-D(0.039)+(iii)-E(0.16) | — | 5 |
| 25 | " | (iii)-F(0.05) | — | 3 |
| 26 | " | (iii)-G(0.065) | — | 2 |
| 27 | " | (iii)-A(0.1)+(iii)-G(0.065) | — | 12 |
| 28 | " | (iii)-B(0.1)+(iii)-G(0.065) | — | 8 |
| 29 | " | (iii)-A(0.1) | (iv)-A(0.1) | 11 |
| 30 | " | (iii)-G(0.065) | " | 3 |
| 31 | (ii)-82(0.063) | (iii)-A(0.1) | — | 9 |
| 32 | " | (iii)-B(0.1) | — | 5 |
| 33 | " | (iii)-C(0.16) | — | 3 |
| 34 | " | (iii)-D(0.039)+(iii)-E(0.16) | — | 4 |
| 35 | " | (iii)-F(0.05) | — | 2 |
| 36 | " | (iii)-G(0.065) | — | 2 |
| 37 | " | (iii)-A(0.1)+(iii)-G(0.065) | — | 11 |
| 38 | " | (iii)-B(0.1)+(iii)-G(0.065) | — | 7 |
| 39 | " | (iii)-A(0.1) | (iv)-A(0.1) | 10 |
| 40 | " | (iii)-G(0.065) | " | 3 |
| 41 | (ii)-8(0.063) | (iii)-A(0.1) | — | 6 |
| 42 | (ii)-9(0.073) | " | — | 5 |
| 43 | (ii)-17(0.076) | " | — | 5 |
| 44 | (ii)-37(0.081) | " | — | 4 |
| 45 | (ii)-73(0.080) | " | — | 4 |
| 46 | (ii)-69(0.063) | " | — | 6 |
| 47 | (ii)-70(0.062) | " | — | 7 |
| 48 | (ii)-66(0.068) | " | — | 3 |

| Comp. Ex. No. | Compound (ii) (amount g) | Compound (iii) (amount g) | Compound (iv) (amount g) | Sensitivity (*1) |
|---|---|---|---|---|
| 1 | (ii)-22(0.071) | — | — | 0 |
| 2 | (ii)-19(0.085) | — | — | 0 |
| 3 | (ii)-15(0.078) | — | — | 0 |
| 4 | (ii)-82(0.063) | — | — | 0 |
| 5 | — | (iii)-A(0.1) | — | 0 |
| 6 | — | (iii)-B(0.1) | — | 0 |
| 7 | — | (iii)-C(0.16) | — | 0 |
| 8 | — | (iii)-D(0.039) | — | 0 |
| 9 | — | (iii)-E(0.16) | — | 0 |
| 10 | — | (iii)-D(0.039)+(iii)-E(0.16) | — | 0 |
| 11 | — | (iii)-F(0.05) | — | 0 |
| 12 | — | (iii)-G(0.065) | — | 0 |
| 13 | — | (iii)-A(0.1)+(iii)-G(0.065) | — | 0 |
| 14 | — | (iii)-A(0.1)+(iii)-G(0.065) | — | 0 |
| 15 | — | (iii)-A(0.1) | (iv)-A(0.1) | 0 |
| 16 | — | (iii)-G(0.065) | — | 0 |

*1: The number of clear steps observed after exposure to light through BP-49 Filter and development.

The results listed in Table 1 clearly indicate that the photopolymerizable compositions of the present invention which comprises Components (ii) and (iii) have high sensitivities and that the sensitivity of the composition is further improved by the incorporation of Component (iv).

We claim:
1. A photopolymerizable composition comprising:
   (i) a polymerizable compound carrying an addition-polymerizable unsaturated bond selected from those compounds carrying at least one terminal ethylenically unsaturated bond in the molecule;
   (ii) a methine compound represented by the following general formula (I):

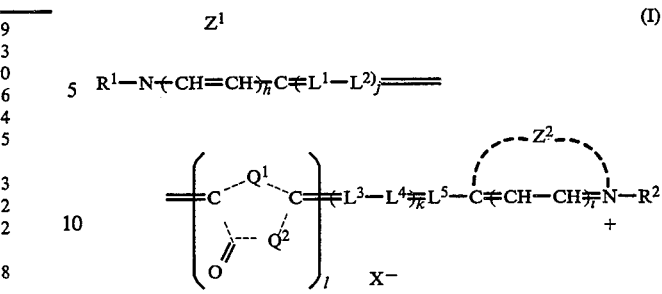

wherein $Z^1$ and $Z^2$ each represents a group of non-metallic atoms required for forming a 5- or 6-membered nitrogen atom-containing heterocyclic ring selected from thiazole rings, benzothiazole rings, naphthothiazole rings, oxazole rings, benzooxazole rings, naphthoxazole rings, selenazole rings, benzoselenazole rings, naphthoselenazole rings, tellurazole rings, thiazoline rings, oxazoline rings, isooxazole rings, benzoisooxazole rings, naphthyridine rings, tetrazole rings, imidazo(4,5-b)quinoxaline rings, or 4,9-dioxo-4,9-dihydronaphtho (2,3-d)imidazole rings, $R^1$ and $R^2$ each represents an alkyl group; $Q^1$ and $Q^2$ represent groups of atoms required for forming a 4-thiazolidinone, 5-thiazolidinone, 4-imidazolidinone, 5-imidazolidinone, 4-oxazolidinone, 5-oxazolidinone or 4-dithiolanone ring together with carbon atoms to which $Q^1$ and $Q^2$ are linked; $L^1$, $L^2$, $L^3$, $L^4$ and $L^5$ each represents a methine group; i and h each represents 0 or 1; l is 1 or 2; j and k each represents 0, 1, 2 or 3; and $X^-$ represents a counter anion;

(iii) at least one compound selected from the group consisting of:
   (a) compounds having carbon-halogen bonds;
   (b) aromatic onium salts;
   (c) organic peroxides;
   (d) thio compounds represented by the following general formula (II):

wherein $R^4$ represents an alkyl or aryl group; $R^5$ represents a hydrogen atom or an alkyl group, or $R^4$ and $R^5$ may be bonded together to form a group of non-metallic atoms required for forming a 5- to 7-membered ring which may comprise hetero atoms selected from oxygen, sulfur or nitrogen atoms;
   (e) hexaaryl-biimidazoles;
   (f) ketoxime esters; and
   (g) compounds represented by the following general formula (III):

wherein $R^6$, $R^7$, $R^8$ and $R^9$ may be the same or different and each represents a substituted or unsubstituted alkyl, aryl, alkenyl, alkynyl or heterocyclic group, provided that at least two of $R^6$, $R^7$, $R^8$ and $R^9$ may be bonded together to form a ring structure and that at least one of them represents an alkyl group; and $Z^+$ represents an alkali metal cation or a quaternary ammonium cation.

2. The photopolymerizable composition of claim 1 further comprising:

(iv) a compound represented by the following general formula (IV):

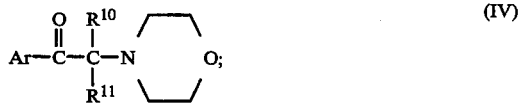  (IV)

wherein Ar represents an aromatic group selected from those represented by the following general formulas and $R^{10}$ and $R^{11}$ each represents a hydrogen atom or an alkyl group or $R^{10}$ and $R^{11}$ may be bonded to form an alkylene group:

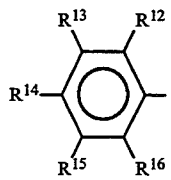

or

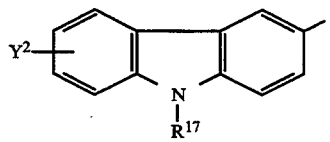

wherein $R^{12}$, $R^{13}$, $R^{14}$, $R^{15}$ and $R^{16}$, may be the same or different, and each represents a hydrogen atom, halogen atom, alkyl group, alkenyl group, a substituted or unsubstituted aryl group, substituted or unsubstituted alkoxy group, a hydroxyl group, $-S-R^{18}$, $-SO-R^{18}$, or $-SO_2R^{18}$, with the proviso that at least one of $R^{12}$, $R^{13}$, $R^{14}$, $R^{15}$ and $R^{16}$ represents $-S-R^{18}$, $-SO-R^{18}$ or $-SO_2R^{18}$ (wherein $R^{18}$ represents an alkyl or alkenyl group); $R^{17}$ represents a hydrogen atom or an alkyl or acyl group; and $Y^2$ represents a hydrogen atom or a group represented by the following general formula:

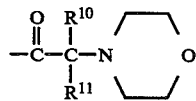

wherein $R^{10}$ and $R^{11}$ are the same as those defined above.

3. The photopolymerizable composition of claim 2 wherein the alkyl group represented by $R^{10}$, $R^{11}$, $R^{17}$ and $R^{18}$ in Formula (IV) is an alkyl group having 1 to 20 carbon atoms; the alkylene group formed through bonding of $R^{10}$ and $R^{11}$ is tetramethylene or pentamethylene; the alkyl group of $R^{12}$ to $R^{16}$ in Ar is an alkyl group having 1 to 4 carbon atoms; the alkenyl group thereof is an alkenyl group having 3 to 12 carbon atoms; the aryl group represented by $R^{12}$ to $R^{16}$ is a phenyl group; the alkoxy group is an alkoxy group having 1 to 4 carbon atoms; the alkenyl group represented by $R^{18}$ is one having 3 to 12 carbon atoms; and the acyl group represented by $R^{17}$ is an acetyl, propionyl or acryloyl group.

4. The photopolymerizable composition of claim 2 wherein the amount of the component (iv) ranges from 0.02 to 20 parts by weight per one part by weight of the component (ii).

5. The photopolymerizable composition of claim 1 wherein the amount of the component (i) ranges from 5 to 50% by weight on the basis of the total weight of the composition.

6. The photopolymerizable composition of claim 1 wherein the component (i) is at least one compound selected from the group consisting of esters of unsaturated carboxylic acids with aliphatic polyhydric alcohols; monomeric amides of aliphatic polyvalent amines with unsaturated carboxylic acids; vinylurethane compounds having at least two polymerizable vinyl groups in the molecule which are prepared by adding vinyl monomers having hydroxyl groups represented by the following general formula (A) to polyisocyanate compounds having at least two isocyanate groups in the molecule:

$$CH_2=C(R)COOCH_2CH(R')OH \quad (A)$$

wherein R and R' each represents $-H$ or $-CH_3$; urethane acrylates; polyester acrylates; polyfunctional acrylates or methacrylates obtained by reacting epoxy resins with (meth)acrylic acids; and photohardenable monomers and oligomers.

7. The photopolymerizable composition of claim 1 wherein the component (ii) is at least one compound selected from those represented by the foregoing general formula (I) wherein $R^1$ and $R^2$ each represents an unsubstituted alkyl group having at most 18 carbon atoms, a cyclic alkyl group, a member of the group consisting of vinyl, vinylmethyl, 2-butenyl, 3-butenyl and 3-hexenyl groups, a branched alkyl group, a substituted alkyl group having not more than 18 carbon atoms, the substituent being selected from the group consisting of carboxyl group, cyano group, halogen atoms, hydroxyl group, alkoxycarbonyl group having not more than 8 carbon atoms, alkoxy groups having not more than 8 carbon atoms, monocyclic aryloxy groups having not more than 10 carbon atoms, acyloxy groups having not more than 8 carbon atoms, acyl groups having not more than 8 carbon atoms, carbamoyl groups, sulfamoyl groups, and aryl groups having not more than 10 carbon atoms; $L^1$, $L^2$, $L^3$, $L^4$ and $L^5$ each represents an unsubstituted methine group or a methine group substituted with at least one member selected from the group consisting of alkyl groups having 1 to 4 carbon atoms, aryl groups having 6 to 10 carbon atoms, substituted alkyl groups having 1 to 9 carbon atoms, alkoxy groups having 1 to 6 carbon atoms and aryloxy groups having 6 to 12 carbon atoms, or a methine group which has a ring on the chain thereof, provided that at least two substituents of the groups $L^1$, $L^2$, $L^3$, $L^4$ and $L^5$ may be bonded together to form a 5- or 6-membered ring on the methine chain and that a substituent of $L^1$ or $L^2$ and $R^1$ may be bonded to form a 5- or 6-membered ring, and that a substituent of $L^3$, $L^4$ or $L^5$ and $R^2$ may be bonded to form a 5- or 6-membered ring; $X^-$ is an anion selected from the group consisting of $SO_4^{2-}$, $S_2O_3^{2-}$, $SO_3^{2-}$, halogen ions, $ClO_4^-$, $BF_4^-$, $PF_6^-$, $SbF_6^-$, $BiCl_5^-$, $AsF_6^-$, $SbCl_6^-$, $SnCl_6^-$, $R-SO_3^-$ and $R-COO^-$, wherein R represents a hydrogen atom or an alkyl, aryl or heterocyclic group.

8. The photopolymerizable composition of claim 1, wherein component (ii)-(a), the compound having a carbon-halogen bond, is at least one member selected from those represented by the following general formulas (V) to (XI):

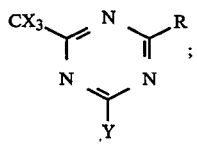
(V)

wherein X represents a halogen atom; Y represents —CX$_3$, —NH$_2$, —NHR', —NR'$_2$ or —OR', wherein R' represents an alkyl, substituted alkyl, aryl or substituted aryl group; and R represents, —CX$_3$, or an alkyl, aryl, or substituted alkenyl group;

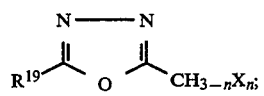
(VI)

wherein R$^{19}$ represents a substituted or unsubstituted alkyl, alkenyl, aryl or alkoxy group, a halogen atom, or a nitro or cyano group; X represents a halogen atom; an n is an integer of 1 to 3;

$$R^{20}-Z-CH_{2-m}X_m-R^{21} \quad (VII);$$

wherein m is 1 or 2; R$^{20}$ represents a substituted or unsubstituted aryl group, R$^{21}$ represents a group represented by:

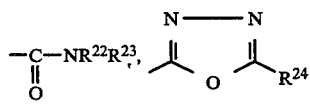

or a halogen atom; Z represents —CO—, —CS— or —SO$_2$—; X is a halogen atom; R$^{22}$ and R$^{23}$ each represents a substituted or unsubstituted alkyl, alkenyl or aryl group; R$^{24}$ is identical to R' defined above in connection with Formula (V);

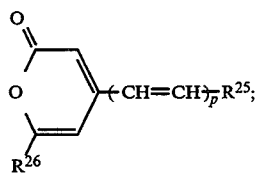
(VIII)

wherein R$^{25}$ represents a substituted or unsubstituted aryl or heterocyclic group; R$^{26}$ represents a trihaloalkyl or trihaloalkenyl group having 1 to 3 carbon atoms; and p is 1, 2 or 3;

carbonylmethylene heterocyclic compounds of the following formula (IX) having trihalogenomethyl groups:

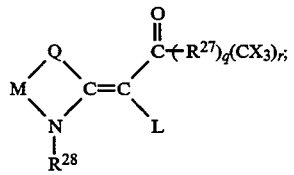
(IX)

wherein L represents a hydrogen atom or a group: —CO—(R$^{27}$)$_n$ (CX$_3$)$_m$; M is a substituted or unsubstituted alkylene group; Q is a sulfur atom, selenium atom, oxygen atom, dialkylmethylene group, alken-1,2-ylene group, 1,2-phenylene group or N—R$^{28}$ group; M and Q may form a 3- or 4-membered ring; R$^{27}$ represents a carbocyclic or heterocyclic aryl group; R$^{28}$ represents an alkyl, aralkyl or alkoxyalkyl group; X is a chlorine, bromine or iodine atom; q represents 0 or 1; if q is 0, r represents 1 and if q is 1, and r represents 1 or 2;

4-halogeno-5-(halogenomethyl-phenyl)oxazole derivatives of the following formula (X):

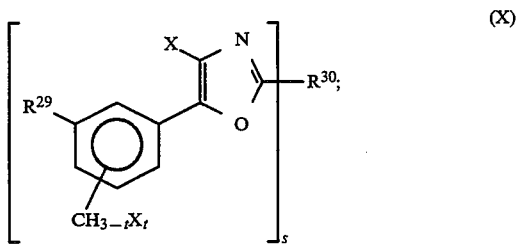
(X)

wherein X is a halogen atom; t is an integer ranging from 1 to 3; s is an integer ranging from 1 to 4; R$^{29}$ is a hydrogen atom or a group —CH$_{3-t}$X$_t$; R$^{30}$ is a substituted or unsubstituted unsaturated organic group having a valency s; and 2-(halogenomethyl-phenyl)-4-halogeno-oxazole derivatives of the following formula (XI):

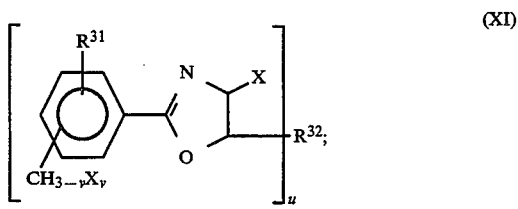
(XI)

wherein X is a halogen atom; v is an integer of 1 to 3; u is an integer of 1 to 4; R$^{31}$ is a hydrogen atom or a group: —CH$_{3-v}$X$_v$; and R$^{32}$ is a substituted or unsubstituted, unsaturated organic group having a valency v.

9. The photopolymerizable composition of claim 1 wherein the component (iii)-(b), the aromatic onium salt, is selected from the group consisting of aromatic onium salts of Group V, VI and VII elements of the Periodic Table.

10. The photopolymerizable composition of claim 9 wherein the onium salt is a BF$_4$ salt or a PF$_6$ salt.

11. The photopolymerizable composition of claim 1 wherein the component (iii)-(c), the organic peroxide compound, is 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3-,4,4'-tetra(p-isopropylcumylperoxycarbonyl)benzophenone or di-t-butyl diperoxyisophthalate.

12. The photopolymerizable composition of claim 1 wherein component (iii)-(d), the thio compound, is selected from those represented by the following general formula (II):

wherein $R^4$ represents an alkyl or substituted or unsubstituted aryl group; $R^5$ represents a hydrogen atom or an alkyl group, provided that $R^4$ and $R^5$ may represent groups of non-metallic atoms required for forming a 5- to 7-membered ring which may comprise hetero atoms selected from oxygen, sulfur or nitrogen atoms.

13. The photopolymerizable composition of claim 12, wherein $R^4$ is an alkyl group having 1 to 4 carbon atoms, or an aryl group having 6 to 10 carbon atoms; and $R^5$ is a hydrogen atom or an alkyl group having 1 to 4 carbon atoms.

14. The photopolymerizable composition of claim 1 wherein the component (iii)-(e), the hexaaryl biimidazole, is selected from the group consisting of 2,2'-bis(o-chlorophenyl)-4,4',5,5'-tetraphenyl biimidazole, 2,2'-bis(o-bromophenyl)-4,4', 5,5'-tetraphenyl biimidazole, 2,2'-bis(o,p-dichlorophenyl)-4,4', 5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole and 2,2'-bis(o-trifluoromethylphenyl)-4,4',5,5'-tetraphenyl biimidazole.

15. The photopolymerizable composition of claim 1 wherein the component (iii)-(f), the ketoxime ester, is selected from the group consisting of 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluene sulfonyloxyiminobutan-2-one and 2-ethoxycarbonyloxyimino-1-phenylpropan-1-one.

16. The photopolymerizable composition of claim 1 wherein the compound as the component (iii)-(g) is selected from the group consisting of those represented by the following general formula (III):

wherein $R^6$, $R^7$, $R^8$ and $R^9$ may be the same or different and each represents a substituted or unsubstituted alkyl, aryl, alkenyl, alkynyl or heterocyclic group and at least two of $R^6$, $R^7$, $R^8$ and $R^9$ may be bonded to form a ring structure, provided that at least one of them represents an alkyl group; and $Z^+$ represents an alkali metal or quaternary ammonium cation.

17. A photopolymerizable composition according to claim 16, wherein said unsubstituted alkyl group represented by $R^6$ to $R^9$ is a linear, branched, or cyclic alkyl group having 1 to 18 carbon atoms; said substituted alkyl group is a linear, branched, or cyclic alkyl group having 1 to 18 carbon atoms, which is substituted with at least one member selected from the group consisting of halogen atom, cyano, nitro, aryl, hydroxyl, —$NR^{34}R^{35}$ wherein $R^{34}$ and $R^{35}$ each independently represents an alkyl group having 1 to 14 carbon atoms, or an aryl group, —$COOR^{36}$ wherein $R^{36}$ represents a hydrogen atom, an alkyl having 1 to 14 carbon atoms, or aryl group, —$OCOR^{37}$, and —$OR^{37}$ groups wherein $R^{37}$ is an alkyl having 1 to 14 carbon atoms, or aryl group; said unsubstituted aryl group represented by $R^6$ to $R^9$ is an aryl group comprising 1 to 3 rings; said substituted aryl group represented by $R^6$ to $R^9$ is an aryl group comprising 1 to 3 rings, which is substituted with at least one member selected from the group consisting of halogen atom, alkyl having 1 to 14 carbon atoms, cyano, nitro, aryl, hydroxyl, —$NR^{34}R^{35}$, —$COOR^{36}$, —$OCOR^{37}$, and —$OR^{37}$ groups;

said unsubstituted alkenyl group represented by $R^6$ to $R^9$ is a linear, branched, or cyclic alkenyl group having 2 to 18 carbon atoms;

said substituted alkenyl group represented by $R^6$ to $R^9$ is a linear, branched, or cyclic alkenyl group having 2 to 18 carbon atoms, which is substituted with at least one member selected from the group consisting of halogen atom, cyano, nitro, aryl, hydroxyl, —$NR^{34}R^{35}$, —$COOR^{36}$, —$OCOR^{37}$, and —$OR^{37}$ groups;

said unsubstituted heterocyclic group represented by $R^6$ to $R^9$ is a 5- to 7-membered heterocyclic group having at least one member selected from the group consisting of N, S, and O, provided that the heterocyclic group may have a condensed ring; said substituted heterocyclic group represented by $R^6$ to $R^9$ is a 5-to 7-membered heterocyclic group having at least one member selected from the group consisting of N, S, and O, which is substituted with at least one member selected from the group consisting of halogen atom, alkyl having 1 to 14 carbon atoms, cyano, nitro, aryl, hydroxyl, —$NR^{34}R^{35}$, —$COOR^{36}$, —$OCOR^{37}$, and —$OR^{37}$ groups; $Z^+$ is $Na^+$, $K^+$, $N^+(CH_3)_4$, or $N^+(n—C_4H_9)_4$.

18. The photopolymerizable composition of claim 1 wherein the amount of the component (iii) ranges from 0.05 to 30 parts by weight per one part by weight of, the component (ii).

19. A photopolymerizable composition according to claim 1, further comprising a linear organic polymer.

20. The photopolymerizable composition of claim 19 wherein the content of the photopolymerization initiator system ranges from 0.01 to 60% on the basis of the total weight of the photopolymerizable ethylenically unsaturated compound and the linear organic polymer.

21. A photopolymerizable composition according to claim 1, further comprising:
(iv) a compound selected from the group consisting of;
(a) compounds represented by formula (IV),

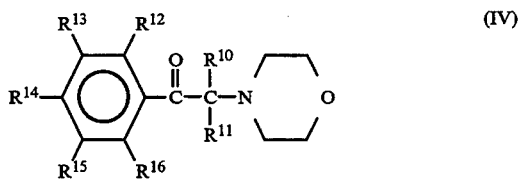

wherein $R^{10}$ and $R^{11}$ each represents a hydrogen atom or an alkyl group, or $R^{10}$ and $R^{11}$ may be bonded to form an alkylene group, and $R^{12}$, $R^{13}$, $R^{14}$, $R^{15}$ and $R^{16}$, may be the same or different, and each represents a hydrogen atom, halogen atom, alkyl group, alkenyl group, a substituted or unsubstituted aryl group, substituted or unsubstituted alkoxy group, a hydroxyl group, —S—$R^{18}$, —SO—$R^{18}$, or —$SO_2R^{18}$, with the proviso that at least one of $R^{12}$, $R^{13}$, $R^{14}$, $R^{15}$ and $R^{16}$ represents —S—$R^{18}$, —SO—$R^{18}$ or —$SO_2R^{18}$ wherein $R^{18}$ represents an alkyl or alkenyl group;
(b) a compound of the formula,
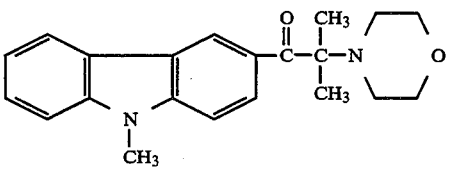
(c) a compound of the formula,
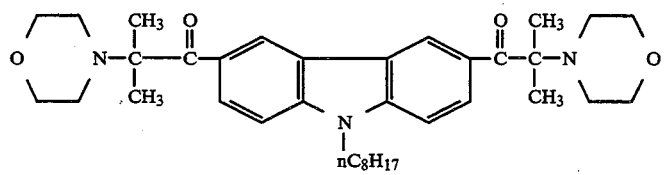
, and
(d) a compound of the formula,
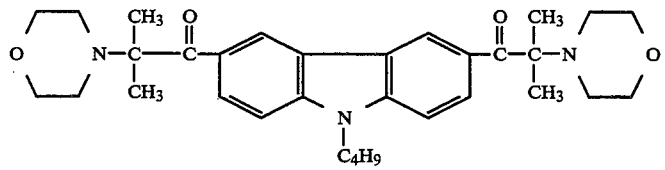
* * * * *